US011762732B2

(12) United States Patent
Noguchi et al.

(10) Patent No.: US 11,762,732 B2
(45) Date of Patent: *Sep. 19, 2023

(54) MEMORY ERROR DETECTION AND CORRECTION

(71) Applicant: Taiwan Semiconductor Manufacturing Company, Ltd., Hsinchu (TW)

(72) Inventors: Hiroki Noguchi, Hsinchu (TW); Yu-Der Chih, Hsinchu (TW); Hsueh-Chih Yang, Hsinchu (TW); Randy Osborne, Beaverton, OR (US); Win San Khwa, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/556,101

(22) Filed: Dec. 20, 2021

(65) Prior Publication Data

US 2022/0114046 A1 Apr. 14, 2022

Related U.S. Application Data

(63) Continuation of application No. 16/535,787, filed on Aug. 8, 2019, now Pat. No. 11,204,826.

(60) Provisional application No. 62/738,177, filed on Sep. 28, 2018.

(51) Int. Cl.
*G06F 11/10* (2006.01)
*G11C 29/52* (2006.01)
*G11C 11/16* (2006.01)

(52) U.S. Cl.
CPC ........ *G06F 11/102* (2013.01); *G11C 11/1655* (2013.01); *G11C 29/52* (2013.01)

(58) Field of Classification Search
CPC .................. G11C 29/44; G11C 11/161; G11C 2029/1202; G11C 29/42; G11C 29/025; G11C 11/1655; G11C 29/52; G06F 11/1012
See application file for complete search history.

(56) References Cited

U.S. PATENT DOCUMENTS

| 7,568,146 B2 | 7/2009 | Takahashi et al. |
| 8,938,656 B2 | 1/2015 | Liu |
| 9,484,113 B2 | 11/2016 | Roberts |

(Continued)

FOREIGN PATENT DOCUMENTS

| CN | 1821971 A | 8/2006 |
| CN | 101622603 A | 1/2010 |

(Continued)

*Primary Examiner* — Guy J Lamarre
(74) *Attorney, Agent, or Firm* — MERCHANT & GOULD P.C.

(57) ABSTRACT

A memory device, such as a MRAM device, includes a plurality of memory macros, where each includes an array of memory cells and a first ECC circuit configured to detect data errors in the respective memory macro. A second ECC circuit that is remote from the plurality of memory macros is communicatively coupled to each of the plurality of memory macros. The second ECC circuit is configured to receive the detected data errors from the first ECC circuits of the plurality of memory macros and correct the data errors.

20 Claims, 19 Drawing Sheets

(56) References Cited

U.S. PATENT DOCUMENTS

| | | | |
|---|---|---|---|
| 9,825,651 B2 | 11/2017 | Rho et al. | |
| 10,056,921 B2 | 8/2018 | Lu et al. | |
| 10,140,175 B2 | 11/2018 | West et al. | |
| 11,204,826 B2* | 12/2021 | Noguchi | G11C 29/025 |
| 2014/0013183 A1 | 1/2014 | Sohn et al. | |
| 2017/0222663 A1 | 8/2017 | Parthasarathy et al. | |
| 2017/0365361 A1 | 12/2017 | Cha et al. | |
| 2018/0053545 A1 | 2/2018 | Son | |

FOREIGN PATENT DOCUMENTS

| | | |
|---|---|---|
| CN | 107767919 A | 3/2018 |
| CN | 108351820 A | 7/2018 |
| KR | 10-2012-0063329 A | 6/2012 |
| KR | 10-2014-0005757 A | 1/2014 |
| KR | 10-2018-0019818 A | 2/2018 |
| WO | 2009/028281 A1 | 3/2009 |

* cited by examiner

MEMORY ERROR DETECTION AND CORRECTION

CROSS-REFERENCE TO RELATED APPLICATION

This application is a continuation of application Ser. No. 16/535,787, filed Aug. 8, 2019, now U.S. Pat. No. 11,204,826, issued Dec. 21, 2021, and titled "Memory Error Detection and Correction", which claims the benefit of U.S. Provisional Patent Application No. 62/738,177, filed Sep. 28, 2018, and titled "MRAM Error Detection and Correction," which applications are incorporated by reference in its entirety.

BACKGROUND

Memory is widely used to store information (both data and program) in a digital system. During the operation of the system, information (bits) stored in the memory may be corrupted due to various reasons. One possible cause of the corruption is due to environmental events both internal to the memory and outside of the memory. One such outside event is a particle strike. There are other reasons which cause the corruption (failure) of bits besides environmental events. When a bit is corrupted, information stored is lost resulting system failure or data lost. Therefore it is important to protect the integrity of the memory content. Various means for protecting the memory content from corruption have been used. Error correction codes (ECC) have the advantage of being able to detect errors in a codeword (both the data field and the check bits), and also to correct errors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
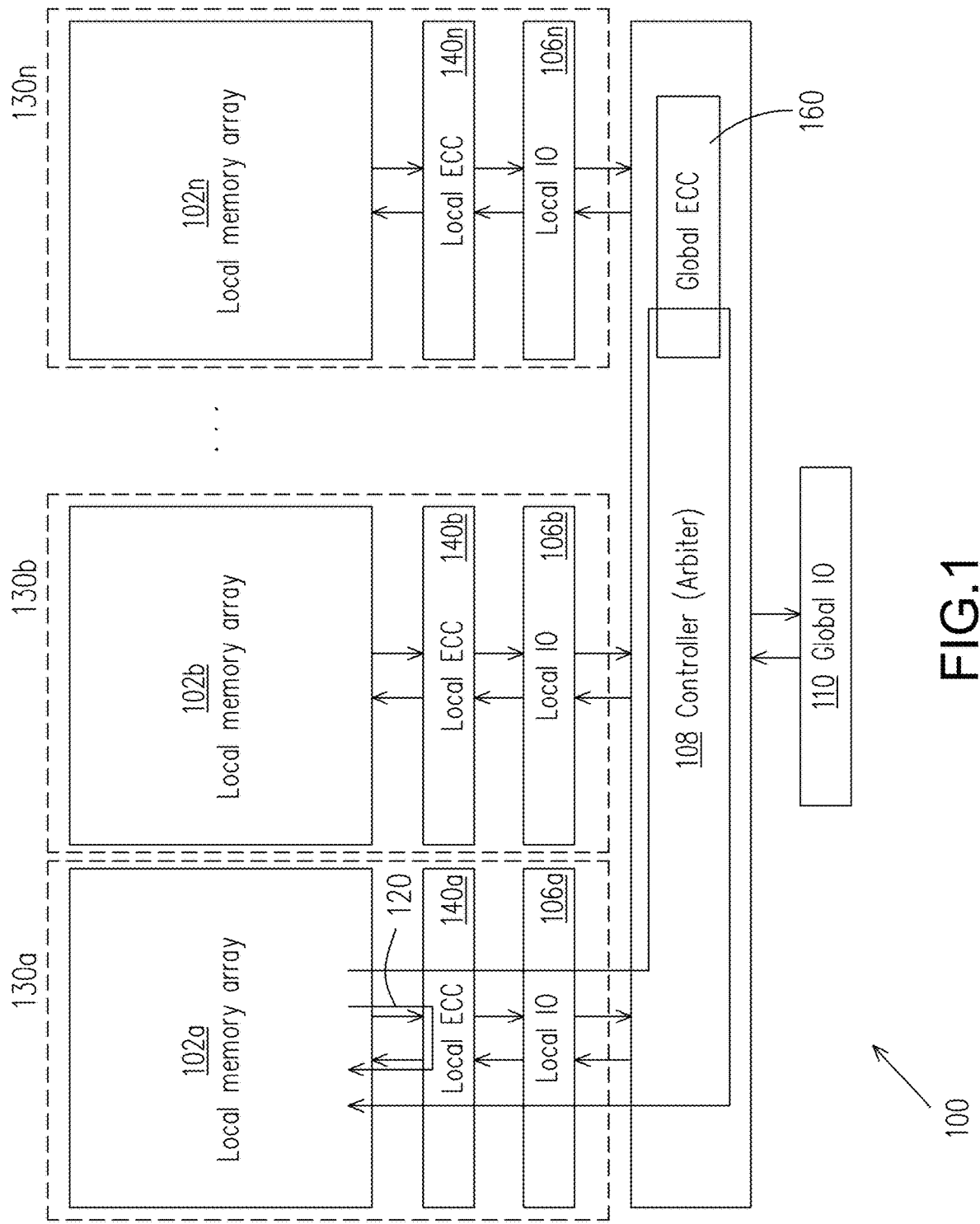
FIG. 1 is a block diagram generally illustrating an example MRAM device having a plurality of MRAM arrays, each having a dedicated and simplified ECC circuit according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory devices are used to store information in semiconductor devices and systems. The popular dynamic random access memory (DRAM) cell includes a switch and a capacitor. DRAMs do not retain data when power is cut off. A nonvolatile memory device is capable of retaining data even after power is cut off. Examples of nonvolatile memory devices include the flash memory, magnetic random access memories (MRAMs), ferroelectric random access memories (FRAMs) and phase-change random access memories (PRAMs). MRAMs store data using variations in the magnetization direction at tunnel junctions. FRAMs store data using polarization characteristics of ferroelectricity. PRAMs store data using resistance variations caused by phase changes of specific materials.

Memory is usually arranged in a 2-dimensional array. A memory array may be a device in and of itself or embedded in another device, and can also include many memory bit cells. Each memory bit cell can typically store one bit of information. A memory macro may include one or more arrays of bit cells and other logic circuitry such as drivers, buffers, clock fan out circuits, ECC circuits, and other peripheral circuitry.

Certain types of memory devices, such as MRAM, have two or more resistance states depending on the state of magnetization alignment between two or more layers of magnetic materials, such as ferromagnetic materials. More particularly, MRAM stores data at memory cells having two superimposed layers of magnetic material separated by a thin insulating film. The layered structure forms a magnetic tunnel junction ("MTJ" or "MTJ element") of an MRAM cell. The two layers include a magnetic layer that is permanently magnetized in a fixed magnetic field alignment direction (this layer is referred to as a "pinned layer") and a changeably-magnetized magnetic layer (this layer is referred to as a "free layer"). The free layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel) or opposite to that of the permanent magnet layer (anti-parallel). The parallel alignment state has a relatively lower resistance and the anti-parallel alignment state has a higher resistance.

The two states of an MRAM cell can be sensed from their relatively higher or lower resistances (RH and RL), which represent different binary logic values of a bit stored in the memory. For example, RL (or high cell current) may be designated as a logical "1" ("Data-1"); RH (or low cell current) may be designated as a logical "0" ("Data-0"). In certain embodiments, a reference voltage can be applied to the MRAM cell, and the resulting cell current can be used to determine whether the cell is in the low resistance state or the high resistance state. In certain embodiments, a sense amplifier can be used to compare the cell current against a reference current.

Data errors, such as soft errors that are not permanent or representative of physical damage to the device may result from disturb errors, radiation effects, or thermal effects. Such errors may be deterministic, or may be by stochastic processes. Data error rates, including soft errors, may require the use of error correction code schemes (ECC) built into the MRAM device chip. ECC can be used to detect and correct bit errors stored in a memory. ECC encodes data by generating ECC check bits, e.g., redundancy bits or parity bits, which are stored along with the data in a memory device. Data and parity bits together form the codeword. For example, an ECC that generates 8 parity bits for 64 bits of data can usually detect two bit errors and correct one bit error in the 64 bits of data, known as a SECDED code, single-error correcting (SEC) and double-error detecting (DED).

Additional memory space may be required to store the check bits used with an ECC. Thus, an additional memory device or devices (e.g. additional chip or chips) may be required to store check bits for providing ECC capability. In some memory arrays, additional columns may be added to the array to store the check bits (also referred to as parity bits). Data included in one row of a memory array may be referred to as a word. A codeword refers to a data string including the word plus parity bits added on in the additional column(s). If a codeword includes a word portion with K bits and M parity bits, the codeword length N would be N=K+M. For example, an ECC memory that can provide 8-bit parity for each 32-bit data word may include a 40-bit wide interface to access a 40-bit codeword with 32-bit data. Similarly, an ECC memory that can provide 8-bit parity for each 64-bit data word may include a 72-bit wide interface to access a 72-bit codeword with 64-bit data.

Providing ECC circuitry for every memory array or macro increases area requirements for the device. An alternative scheme that minimizes the area requirement necessary for ECC circuitry is to provide global ECC circuitry that is shared among the memory arrays or macros. However, a scheme using shared ECC circuitry for the memory arrays or macros increases the energy consumed in moving or propagating the data to and from the memory arrays and the ECC circuitry, as compared with providing ECC circuitry for every memory array or macro.

Detection of bit errors in a codeword requires fewer operations than bit error correction, and as such requires less circuitry to support the fewer operations. In accordance with disclosed embodiments, a first portion of ECC circuitry are provided local to each memory macro, while a second portion is implemented as a shared, global ECC accessed by all of the memory macros of the memory device. For example, error detection aspects of the ECC circuit may be implemented as a first, local ECC for each MRAM macro or for a small group of macros. Error correction aspects of the ECC are implemented as a second, or global ECC that supports many MRAM macros. In this manner, only memory errors detected by the local ECC must be transmitted to the global ECC for error correction.

A hierarchical ECC structure such as this having local and global ECC implementations can effectively balance the area requirements and power consumption of a device related to error correction by reducing the area of overhead ECC circuitry as compared with providing local full ECC with every memory array or macro, and reducing the global data communication energy as compared with providing shared global full ECC. The global data communication energy is reduced by moving or propagating only detected memory errors to the global ECC circuitry for correction, and the device area requirements are minimized by providing only detection ECC circuitry with every memory array or macro while error correction circuitry is provided for by shared global ECC circuitry.

FIG. 1 is a block diagram generally illustrating an example memory device having a plurality of memory arrays, each having a dedicated and simplified ECC circuit, in accordance with some embodiments of the present disclosure. In the example shown in FIG. 1, the memory device may be an MRAM device 100, though other memory types are within the scope of the disclosure. The MRAM device 100 includes a plurality of memory arrays 102a-n, local ECC circuits 140a-n coupled to respective memory arrays 102, local I/O circuits 106a-n coupled to respective memory arrays 102 and ECC circuits 140, a controller 108 coupled to each of the local I/O circuits 106, a global ECC circuit 160, and a global I/O circuit 110. In the embodiment shown, memory macros 130a-n may include the local memory arrays 102a-n, the local ECC 140a-n, and the local I/O 106a-n.

According to some embodiments, if the refresh interval is designed properly, most of the read operations in a memory refresh should be relatively error-free. In such a case, an ECC scheme can be implemented in which simple error detection functions can be performed locally, resulting in a shorter local refresh data path 120 and decreased latency during refresh. An ECC circuit including error correction could then be shared among a plurality of macros 130a-n, and the longer global refresh data path 122 would be used for such comparatively rare events. In such a scheme, the area needed for the local ECC circuits 140a-n having only error detection would each require significantly less area.

Many schemes have been developed to implement ECC, including Hamming codes, triple modular redundancy, and others. Hamming codes, for example, are a class of binary linear block codes that, depending on the number of parity bits utilized, other can detect up to two bit errors per codeword, or correct one bit error without detection of uncorrected errors. Several schemes have been developed, but in general, if parity bits are arranged within a codeword such that different incorrect bits produce different error results, the bits in error can be identified. For a codeword with errors, the pattern of errors is called the error syndrome and identifies the bit in error. Such syndrome decoding is a highly efficient method of decoding linear block codes having errors.

As described herein, the local ECC 140a-n and the global ECC 160 may utilize ECC encoding and decoding using ECC encoders and decoders. An ECC encoder may include any technique or algorithm that adds redundancy to information to detect or correct errors. For example, error correcting codes can include non-binary block codes such as the Reed-Solomon [255, 239] or [255, 221] codes, linear block codes such as Hamming codes and Bose-Chaudhuri-Hocquenghem (BCH) codes, cyclic Hamming codes, Hadamard codes such as the Hadamard [16, 5] code, Golay codes such as the Golay [23, 12] code, the extended Golay [24, 12] code, or the cyclic Golay [24, 12] code, maximum length shift-register codes, a Reed-Muller code, an alternate code, a Gappa code, binary and non-binary convolutional codes, dual-K codes, turbo codes, turbo product codes, LDPC codes, concatenated codes made from enclosing one code inside another, and the like. The strength of the error correcting code can be adjusted as needed by adding more parity bits. For example, the strength of a code can be measured by a minimum Hamming distance. An ECC decoder may be coupled to an ECC encoder and used to compute a syndrome of a codeword.

In some embodiments, and in particular, an ECC decoder may be included in the local ECC 140a-n and perform matrix multiplication on a predefined parity-check matrix and the codeword. The predefined parity check matrix may be determined according to the type of the employed ECC. For example, the predefined parity-check matrix may be the 7×3 parity-check matrix H of a (7, 4) Hamming code. Accordingly, the ECC decoder outputs a 3-tuple vector comprised of 3 bits. The ECC decoder is for checking whether the encoded codeword is a valid codeword based on the principle of the (7, 4) Hamming code. When the 3-tuple vector, i.e. the syndrome, produced by the ECC decoder equals (0, 0, 0), the encoded codeword is determined to be a valid codeword. In this case, only operations with determining that the codeword is valid are needed, and local refresh data path 120 is utilized. When the 3-tuple vector, produced by the ECC decoder does not equal to (0, 0, 0) in operation, the encoded codeword is determined to have at least one error. In this case, a more complete ECC including error correction is required, and global refresh data path 122 is utilized.

Figure 2:
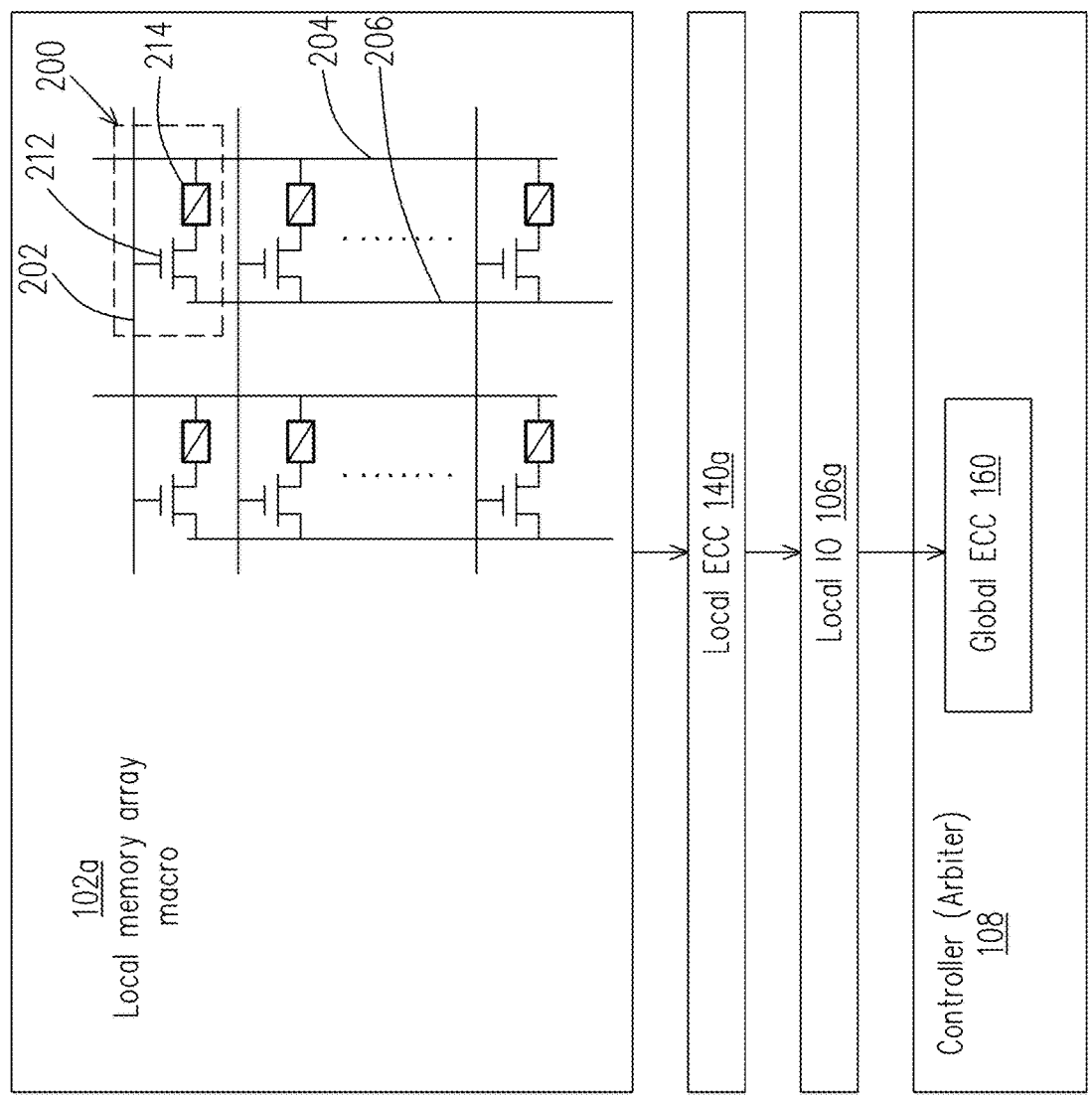
FIG. 2 is a block diagram generally illustrating an example MRAM cell within an MRAM array according to an embodiment.

FIG. 2 is a block diagram generally illustrating further aspects of an example of the MRAM device 100. In the embodiment shown, the local memory array 102a includes a plurality of MRAM bit cells, such as MRAM bit cell 200, arranged in rows and columns. The MRAM bit cell 200 includes an access transistor 212 and an MTJ element 214. The MTJ element 214 has a variable resistance depending on orientation of its free layer, and is operatively coupled between the access transistor 212 and a bit line 204. The access transistor 212 is operatively coupled between a bit line 206 and the MTJ element 214, and has a gate coupled to a word line 202. During a read or write operation, a voltage greater than the threshold voltage of the access transistor 212 is applied to the word line 202 thereby "turning on" the access transistor 212 and allowing a current to flow from the bit line 206 through the MTJ element 214 to the bit line 204. The current is detected by a sense amplifier (not shown) which is able to sense and compare the current in the bit lines and output a logic high "1" or low "0" corresponding the state of the free layer in the MTJ element 214 and ultimately the data ("1" or "0") stored in the MRAM bit cell 200. Access to any of the plurality of bit cells in the local memory array 102a is performed by correctly timing the application of voltages to the word lines and sensing the current on the respective bit lines. The data of the bit cells in the local memory array 102a can be transmitted to the local ECC circuit, for example, via the bit lines 204 and 206. The data of the bit cells in the local memory array 102a is transmitted to, and received from, circuits that are external to the macro 130a as illustrated in FIG. 1 through the local I/O circuit 106a, for example, via the bit lines 204 and 206.

Figure 3:
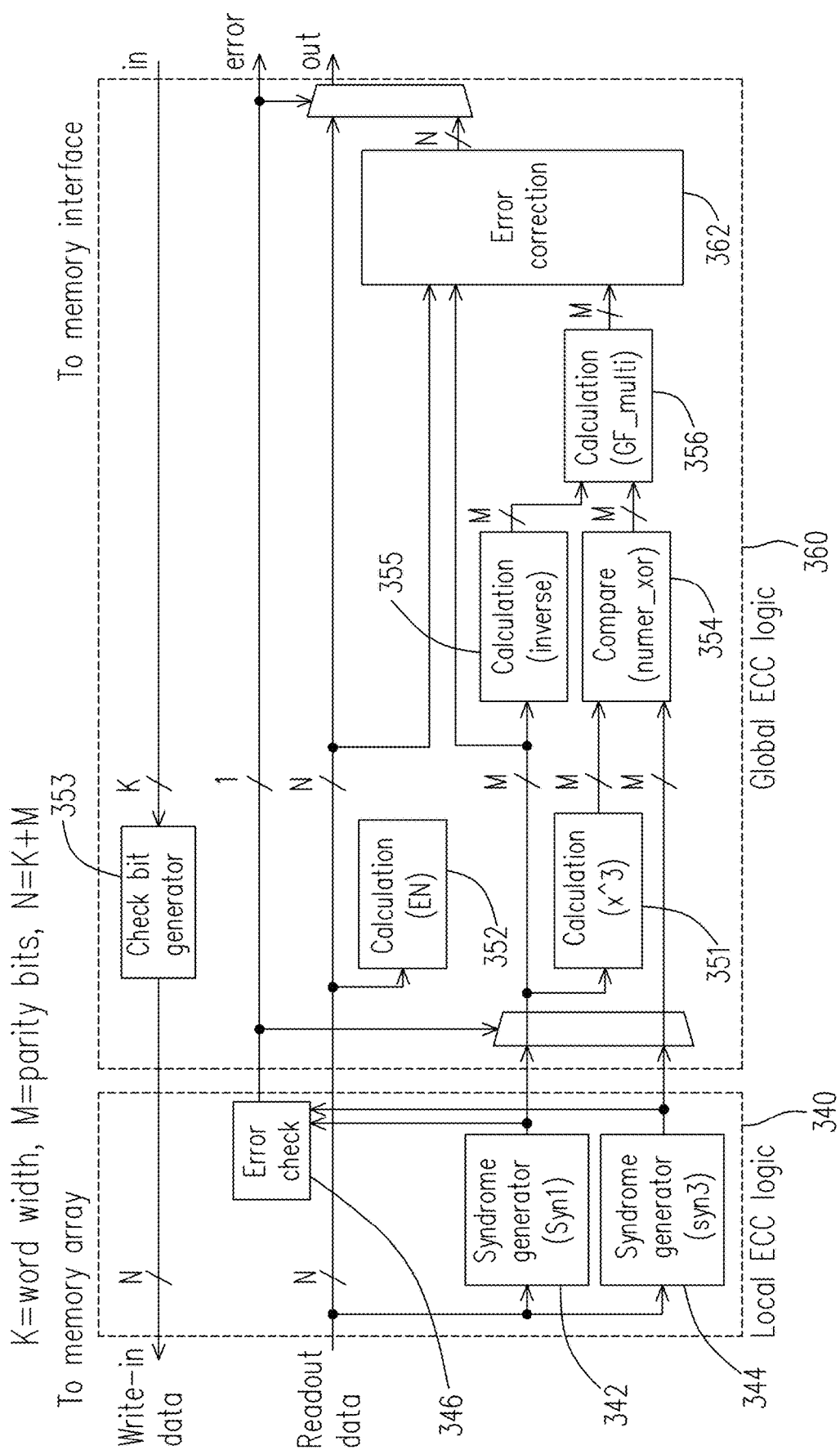
FIG. 3 is a block diagram generally illustrating an example ECC logic process for MRAM error correction according to an embodiment.

FIG. 3 is a block diagram generally illustrating an example ECC logic process 300 for MRAM error correction according to an embodiment. In the embodiment shown, the ECC logic process 300 includes a local ECC logic 340 and a global ECC logic 360. In some embodiments, the local ECC logic 340 is provided with a memory array or macro, and the global ECC logic 360 is shared among a plurality of memory arrays or macros. For example, referring to FIG. 1, the local ECC logic 340 can correspond to the local ECC circuit 140a provided with the local memory array 102a in the local memory macro 130a, and the global ECC logic can correspond to the global ECC circuit 160 that is shared among the plurality of memory macros 130a-n.

The local ECC logic 340 includes a syndrome s1 generator 342, a syndrome s3 generator 344, and an error check circuit 346. The MRAM bit cells 200 in the memory arrays 102a-n store both data and parity bits for error detection and correction. In the example shown, the ECC logic process 300 operates on a codeword that is read from the local memory array 102a, e.g. an N-bit length readout data read from MRAM macro 130a. In some embodiments, only syndrome s1 and s3 are necessary to determine whether the readout data has an error, and therefore only a partial decoding of the readout data is necessary. Syndrome s1 and s3 may be single numerical elements, or syndrome s1 and s3 may each be a vector of a plurality of numerical elements, or syndrome s1 and s3 may be a matrix of a plurality of numerical elements. The syndrome s1 generator 342 performs matrix multiplications on the readout data using a predefined parity-check matrix to arrive at syndrome s1, and similarly syndrome s3 generator 344 performs matrix multiplications on the predefined parity-check matrix to arrive at syndrome s3. The error check circuit 346 is configured to evaluate syndromes s1 and s3 and determine whether the readout data, e.g. the codeword, contains at least one error.

In cases where it is determined by the error check circuit 346 that the readout data contains at least one error, a full decoding of the readout data is necessary requiring the global ECC logic 360. The global ECC logic 360 includes an x^3 (x-cubed) calculation circuit 351, an encoder (EN) calculation circuit 352, a check bit generator 353, a XOR (exclusive OR) calculation circuit 354, an inverse calculation circuit 355, a finite field such as a Galois Field (GF) multi calculation circuit 356, and an error correction circuit 362. In some embodiments, the EN calculation circuit 352 operates on the readout data and outputs a single bit that encodes whether the codeword needs to be written back to the local memory array 102*a* after correction. For example, the EN calculation circuit 352 can be the encoder stage of a BCH cyclic error-correcting code. In some embodiments, the EN calculation circuit 352 adds a parity bit such that the global ECC logic 360 can have an additional error detection in addition to the correction, e.g., single-error-correction double-error-detection (SECDED), double-error-correction triple-error-detection (DECTED), etc. In the embodiment shown in FIG. 3, syndromes s1 and s3 are calculated in the local ECC logic 340, and are transmitted and used by the global ECC logic 360. In particular, the x^3 calculation circuit 351 operates on syndrome s1 to arrive at s1^3, the XOR calculation circuit 354 operates on syndrome s3 and the resulting s1^3 from the cube calculation circuit 351 to compare s3 and s1^3 and output a vector according to a XOR truth table. The inverse calculation circuit 355 operates on syndrome s1 and outputs the inverse of syndrome s1, and the GF multi calculation circuit 356 operates on the output of the inverse calculation circuit 355 and the XOR calculation circuit 354. In some embodiments, the GF multi calculation circuit 356 can be the decoder stage of a BCH cyclic error-correction code, including error detection and error correction. In some embodiments, the GF multi calculation circuit 356 operates on the codeword via multiplication and accumulation in the Galois Field of every data bit, where the data bits are treated as coefficients of polynomials. The output of the GF multi calculation circuit 356 is input into the error correction circuit 362 along with the readout data and syndrome s1. The output of the error correction circuit 362 is the error-corrected codeword. The check bit generator 353 then operates on the corrected word, e.g. the data without the parity bits, encodes parity bits according to the predefined parity-check matrix of the chosen ECC type or scheme, forming the corrected codeword to be written to the local memory array 102*a*.

Figure 4:
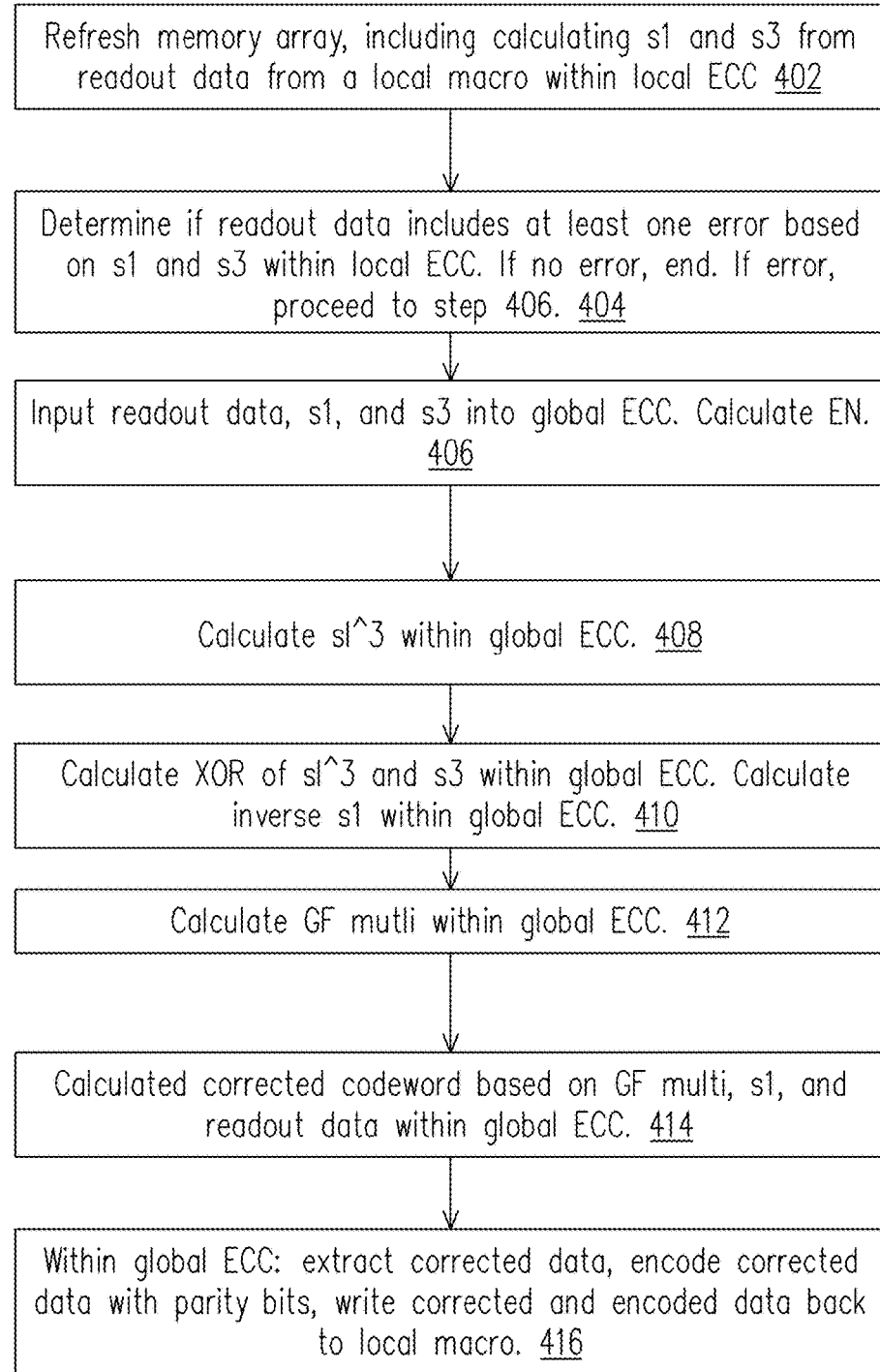
FIG. 4 is a flowchart of a method for correcting MRAM errors using an ECC logic process according to an embodiment.

FIG. 4 is a flowchart of a method 400 for correcting MRAM errors using the ECC logic process 300 illustrated in FIG. 3. Method 400 begins at step 402 in which syndromes s1 and s3 are calculated from readout data as part of a memory refresh operation for memory arrays. For example, a codeword from one of a plurality of macros 130*a-n* including the local memory arrays 102*a-n* is read out, and syndromes s1 and s3 are calculated by performing matrix multiplications on the readout data using a predefined parity-check matrix within a local ECC circuit 140*a-n* associated with the local memory array 102*a-n* from which the readout data originates during the refresh cycle. In some embodiments, the calculation of syndromes s1 and s3 can be performed using the s1 syndrome generator 342 and the s3 syndrome generator 344 within the local ECC logic 340, as illustrated in FIG. 3. At step 404, syndromes s1 and s3 are evaluated to determine if the codeword has at least one error, for example, using error check 346 within the local ECC logic 340. If there is no error, method 400 ends for that codeword, and begins at step 402 for the next codeword in the refresh cycle for the local memory array 102*a-n*. If there is at least one error, the method 400 proceeds to step 406 in which the readout data and syndromes s1 and s3 are input into a global ECC circuit 160, such as global ECC logic 360, associated with a plurality of local macros, including the local macro from which the current readout data determined to have at least one error has originated. Whether the codeword needs to be written back to the local memory array 102 after correction is determined from the readout data, for example, by using the EN calculation circuit 352. For example, the EN calculation circuit 352 can be the encoder stage of a BCH cyclic error-correcting code. In some embodiments, the EN calculation circuit 352 adds a parity bit such that the global ECC logic 360 can have an additional error detection in addition to the correction, e.g., single-error-correction double-error-detection (SECDED), double-error-correction triple-error-detection (DECTED), etc. At step 408, s1^3 is calculated by x^3 calculation circuit 351 within the global ECC logic 360. At step 410, the XOR of inputs s1^3 and s3 is calculated such as by the XOR calculation circuit 354 within the global ECC logic 360, and the inverse of s1 is calculated, such as by the inverse calculation circuit 355 within the global ECC logic 360. At step 412, the GF multi is calculated, for example by the GF multi calculation circuit 356 using the outputs from the inverse s1 and XOR calculations. In some embodiments, the GF multi calculation circuit 356 can be the decoder stage of a BCH cyclic error-correction code, including error detection and error correction. In some embodiments, the GF multi calculation circuit 356 operates on the codeword via multiplication and accumulation in the Galois Field of every data bit, where the data bits are treated as coefficients of polynomials. At step 414 a corrected codeword is calculated such as by the error correction circuit 362 within the global ECC logic 360 using the readout data and the outputs of the GF multi and syndrome s1 calculations. At step 416, the corrected word, e.g. the corrected data, is extracted from the corrected codeword and a check bit generator, for example the check bit generator 353 within the global ECC logic 360, encodes the corrected data with parity bits using a predefined parity-check matrix according to a chosen ECC type or scheme. The corrected and encoded codeword is then written back to the local macro 130.

Figure 5:
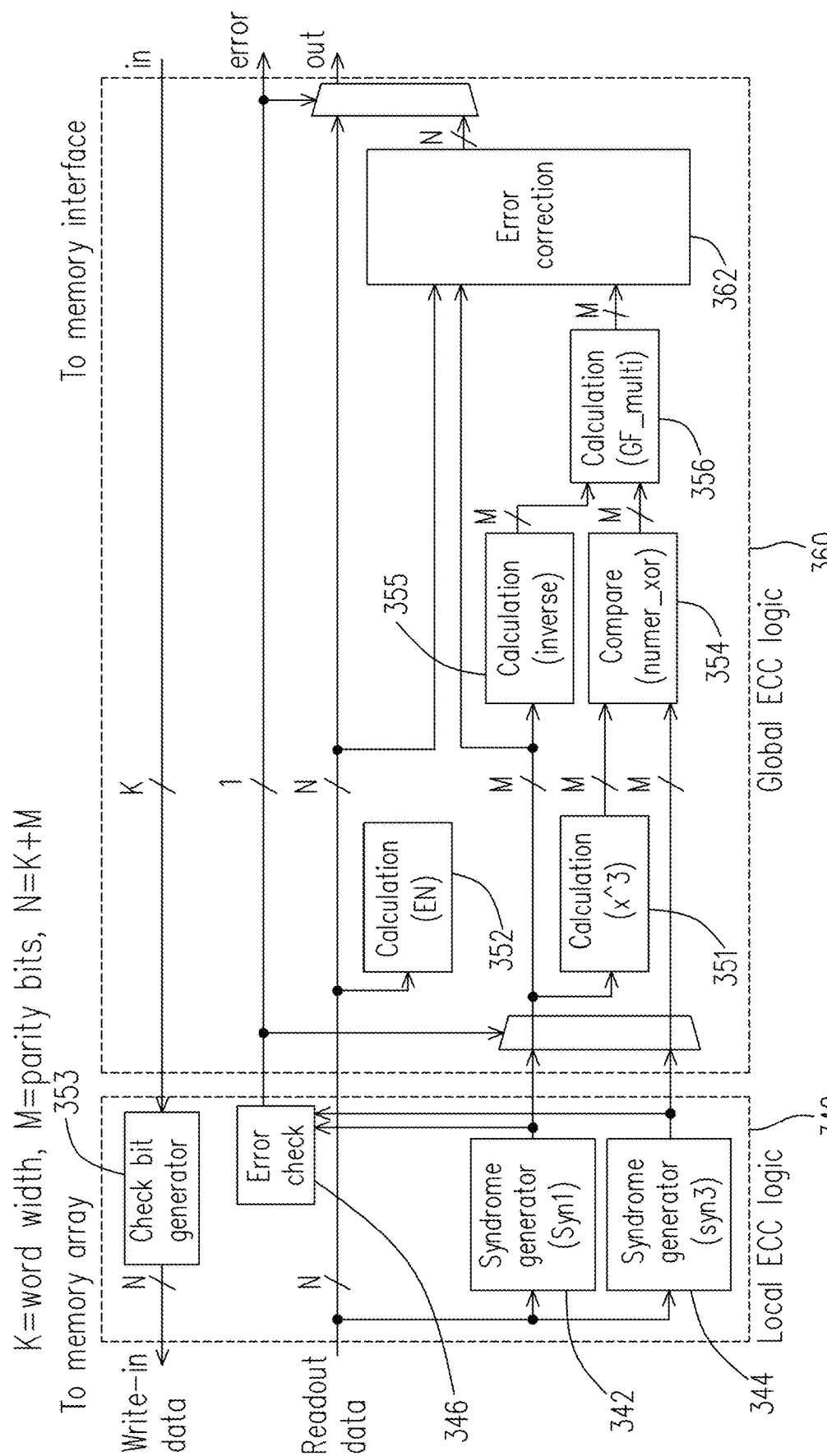
FIG. 5 is a block diagram generally illustrating an example ECC logic process for MRAM error correction according to an embodiment.

FIG. 5 is a block diagram generally illustrating an example ECC logic process 500 for MRAM error correction according to an embodiment. In the ECC logic process 500, compared to the ECC logic process 300 of FIG. 3, the check bit generator 353 is no longer included in the global ECC logic 360, but is included in the local ECC logic 340. This difference from the ECC logic process 300 offloads the operations of encoding parity bits into the corrected data and writing the resulting corrected codeword to the local memory array 102*a* to the local ECC logic 340 associated with the local memory array 102*a*, such that the global ECC logic 360 is no longer responsible for encoding parity bits and writing corrected codewords back to the local memory arrays 102*a-n* for the plurality of macros that share the global ECC logic 360.

Figure 6:
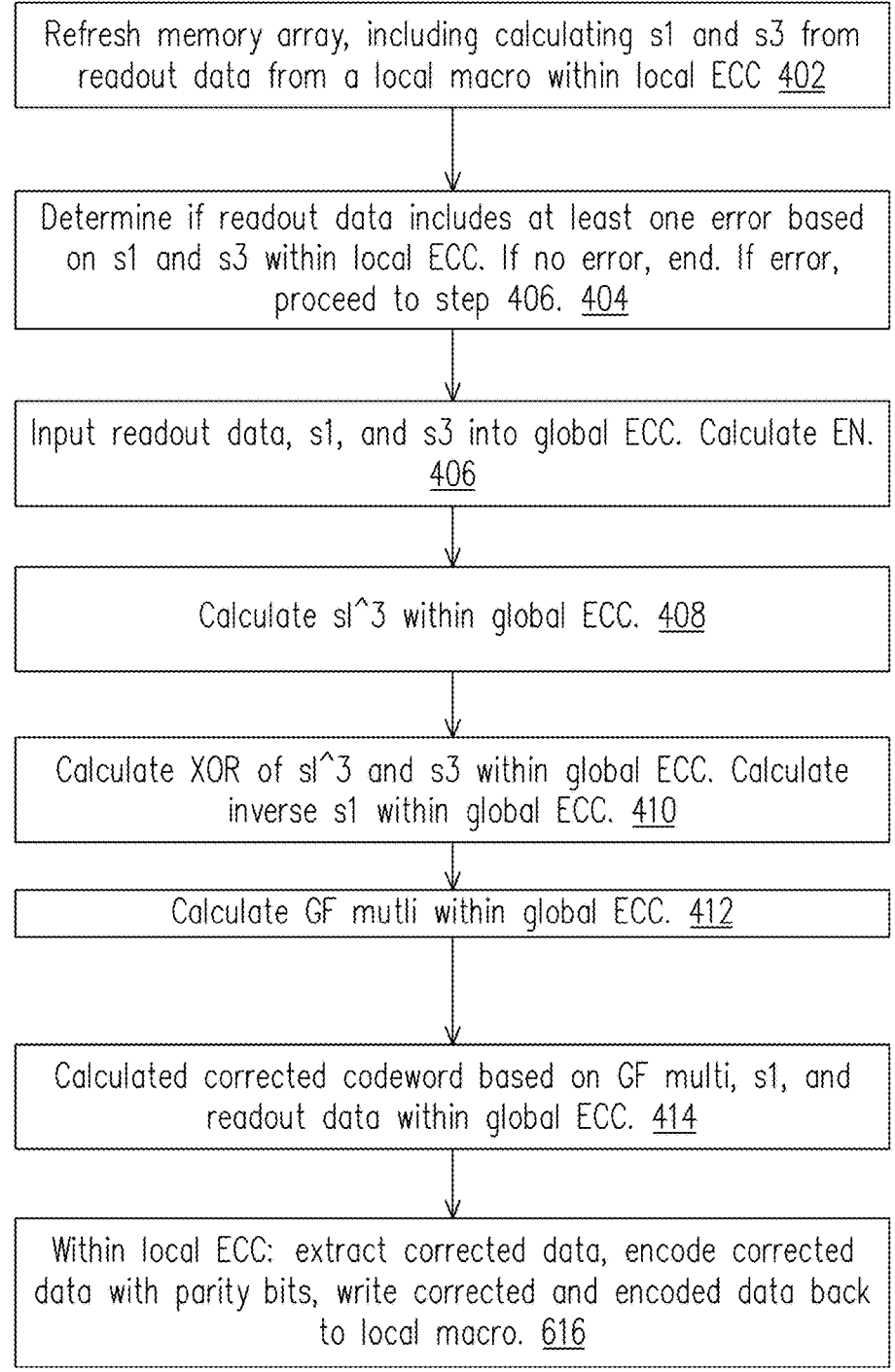
FIG. 6 is a flowchart of a method for correcting MRAM errors using an ECC logic process according to an embodiment.

FIG. 6 is a flowchart of a method 600 for correcting MRAM errors using the ECC logic process 500. Method 600 is similar to the method 400 above, the difference being that at step 616, the same operations included in step 416 are performed within the local ECC rather than the global ECC, offloading that work to the local ECC logic circuit as described above in connection with FIG. 5. In particular, step 616 includes extracting the corrected word, e.g. the corrected data, from the corrected codeword and encoding the corrected data with parity bits using a predefined parity-check matrix according to a chosen ECC type or scheme, and writing the corrected and encoded codeword back to the local macro associated with the local ECC logic circuit.

Figure 7:
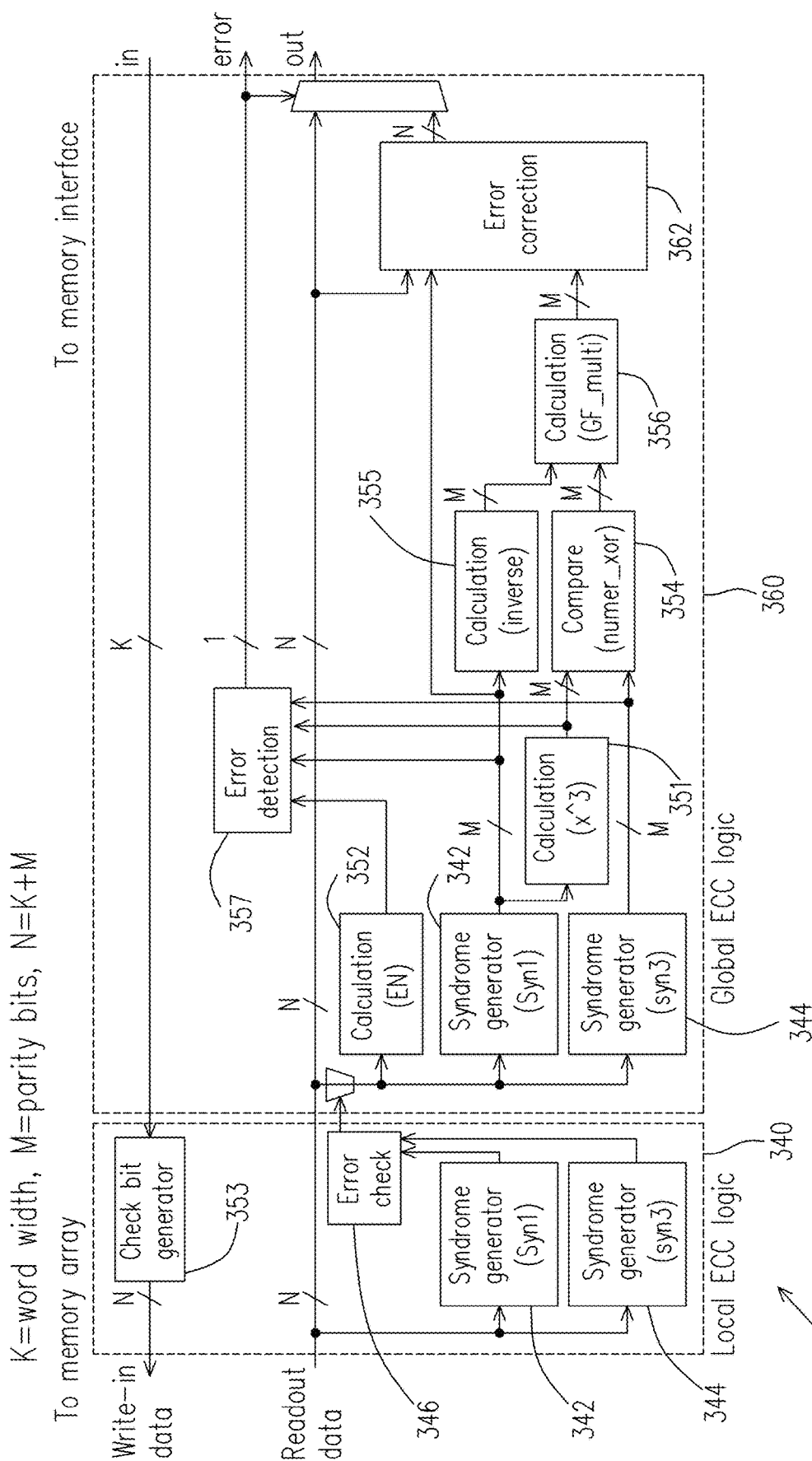
FIG. 7 is a block diagram generally illustrating an example ECC logic process for MRAM error correction according to an embodiment.

FIG. 7 is a block diagram generally illustrating an example ECC logic process 700 for MRAM error correction according to an embodiment. The ECC logic process 700 is similar to the ECC logic process 500 above, including two differences. The first difference is that the syndrome s1 generator 342 and the syndrome s3 generator 344 are duplicated within the global ECC logic 360. Duplicating the syndrome s1 generator 342 and the syndrome s3 generator 344 within the global ECC logic 360 may reduce the number of connections needed within the overall hierarchical ECC scheme, and may also simplify the layout structure. For example, the ECC logic processes 300 and 500 require every local ECC circuit 140*a-n* and local I/O circuit 106*a-n* to support transmission of the readout data and the syndromes s1 and s3, and require the global ECC circuit 160 to support receiving the syndromes s1 and s3 along with the readout data. In contrast, the ECC logic process 700 only requires the local ECC circuits 140*a-n* and local I/O circuits to support transmission of the readout data, and only requires the global ECC circuit 160 to support receiving the readout data. As such, in some embodiments, connections required for transmission of the syndromes s1 and s3 between the local I/O circuits 106*a-n* and the global ECC circuit 160 can be eliminated using the ECC logic process 700, which can simplify the layout structure of the MRAM device 100.

The second difference is that an error detection circuit 357 is included within the global ECC logic 360. Similar to the error check circuit 346, the error detection circuit 357 is configured to determine whether the readout data, e.g. the codeword, contains at least one error, but does so within the global ECC logic 360. Error detection circuit 357 receives the output of the EN calculation circuit 351, s1, s3, and s1^3 as inputs, and outputs whether the readout data contains at least one error. Error detection circuit 357 may output whether there is at least one error in the readout data, or whether there are at least two errors in the readout data, and may output whether there are at least three or more errors in the readout data.

Figure 8:
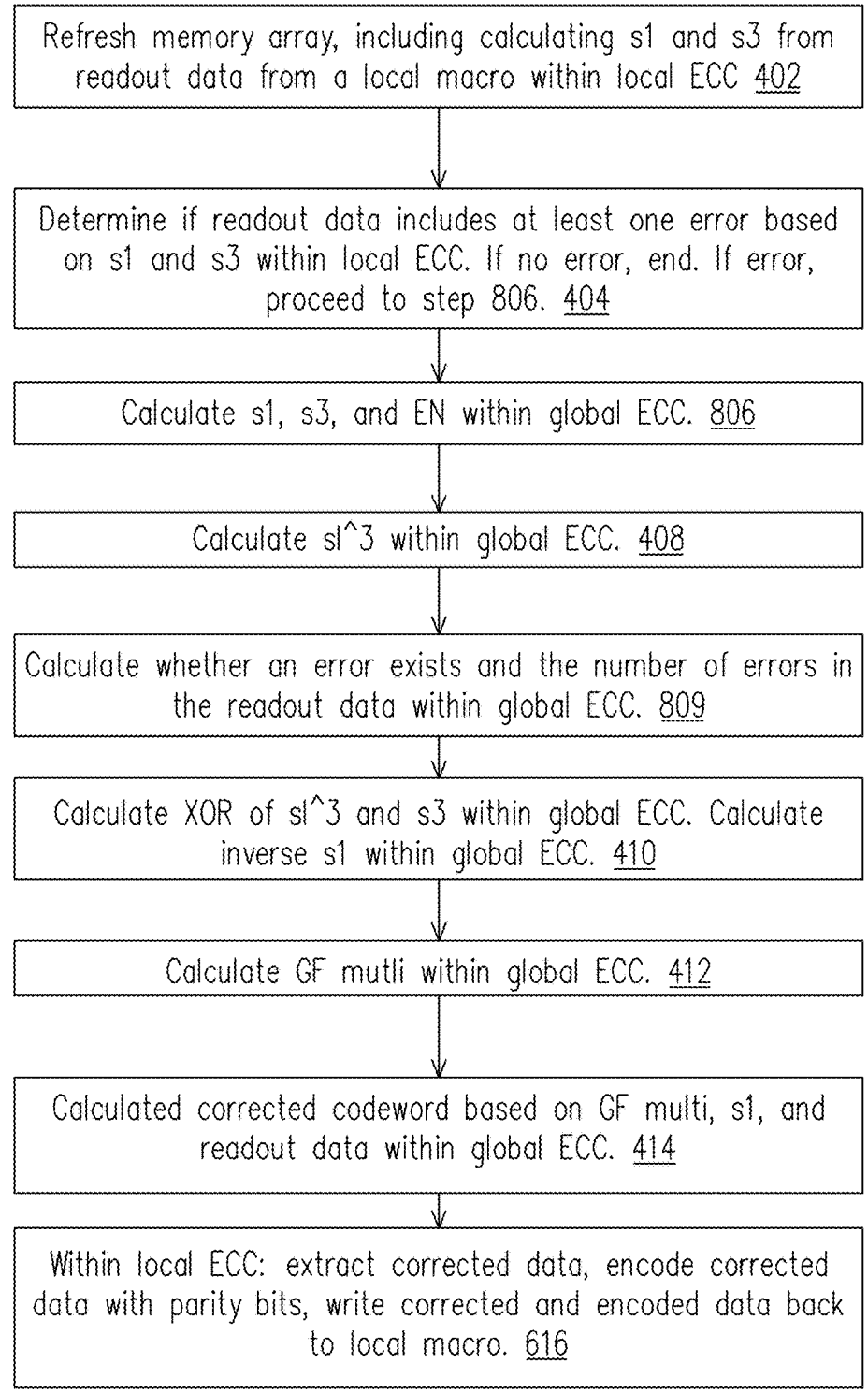
FIG. 8 is a flowchart of a method for correcting MRAM errors using an ECC logic process according to an embodiment.

FIG. 8 is a flowchart of a method 800 for correcting MRAM errors using ECC logic process 700. The Method 800 is similar to the method 600 above, with two differences. First, step 406 is replaced with step 806, in which s1 and s3 are calculated within the global ECC circuit 160 (e.g. global ECC logic 360) rather than being input from same operations included in step 406 of the methods 400 and 600. Second, between steps 408 and 410, at step 809, whether an error in the readout data exists and the number of errors is calculated within the global ECC circuit 160 (e.g. error detection circuit 357).

Figure 9:
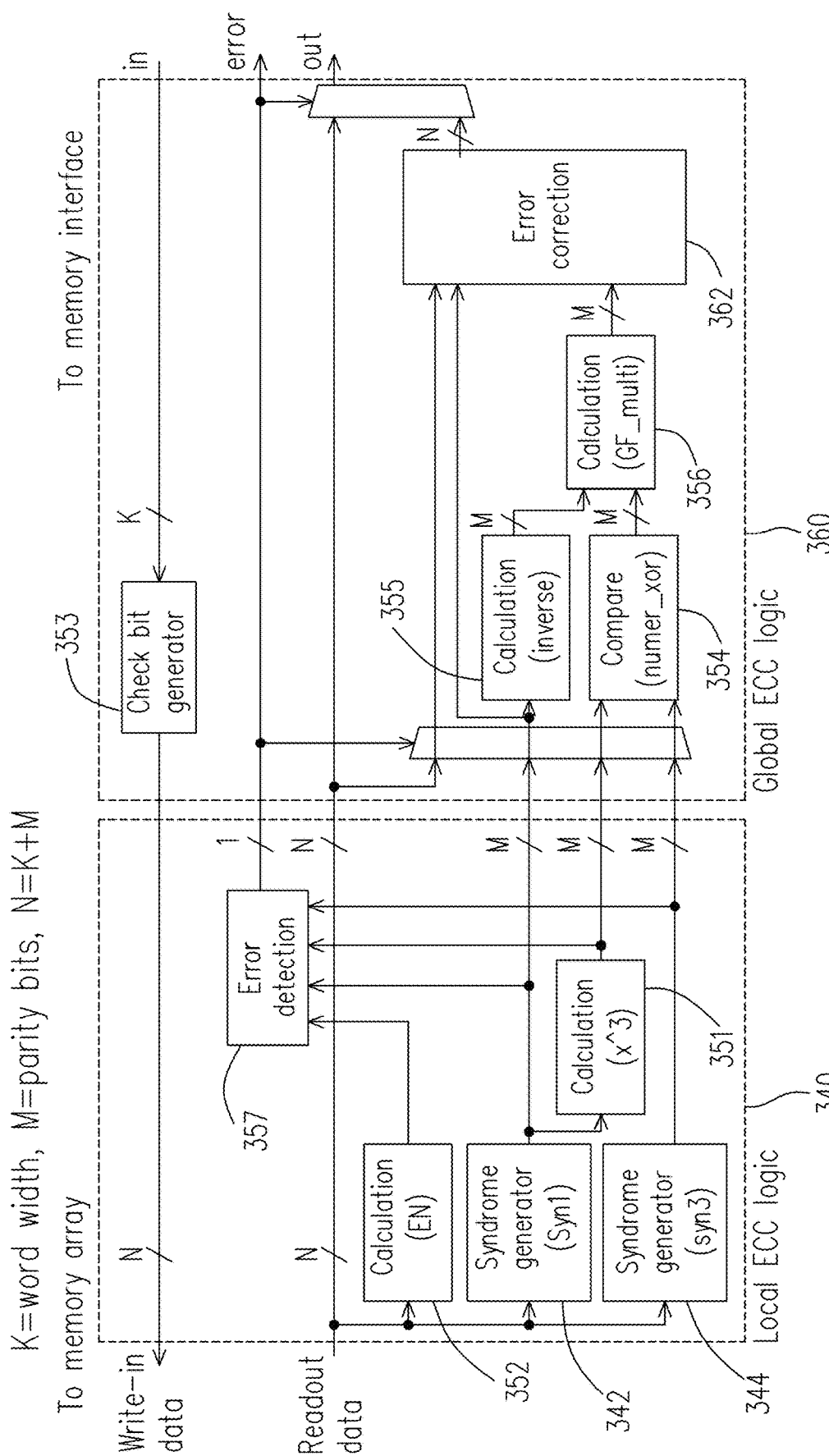
FIG. 9 is a block diagram generally illustrating an example ECC logic process for MRAM error correction according to an embodiment.

FIG. 9 is a block diagram generally illustrating an example ECC logic process 900 for MRAM error correction according to an embodiment. The ECC logic process 900 is similar to the ECC logic process 700 above with four differences. First, the syndrome s1 generator 342 and the syndrome s3 generator are no longer duplicated within the global ECC logic 360. Second, the cube calculation circuit 351, the EN calculation circuit 352, and the error detection circuit 357 are included in the local ECC logic 340 and are no longer included in the global ECC logic 360. Including the cube calculation circuit 351, the EN calculation circuit 352, and the error detection circuit 357 within the local ECC logic 340 increases the computational utility and power of the local ECC logic 340. For MRAM devices 100 that experience a relatively higher data error rate, both the energy consumption burden of moving data and latency of data due to offloading error detection and correction operations to the shared global ECC circuit 160 can outweigh the area-saving benefits of removing circuitry to perform those operations in the local memory macros 130*a-n*. In such cases, the efficiency of the MRAM device 100 can be increased by adjusting the balance between area, energy consumption, and data latency associated with error checking by increasing the operations performed locally. For example, by including EN calculation and syndrome s1 cube calculation, the local ECC logic 340 of the ECC logic process 900 can also include error detection, e.g. via error detection circuit 357, and as such can detect the number of errors more precisely, including detecting whether an error is present in the codeword and also the number of errors within the codeword and word.

The third difference is that the error check circuit 351 is omitted. The fourth difference is that the check bit generator 353 is once again included in the global ECC logic 360 rather than the local ECC logic 340, similar to the ECC logic process 300.

Figure 10:
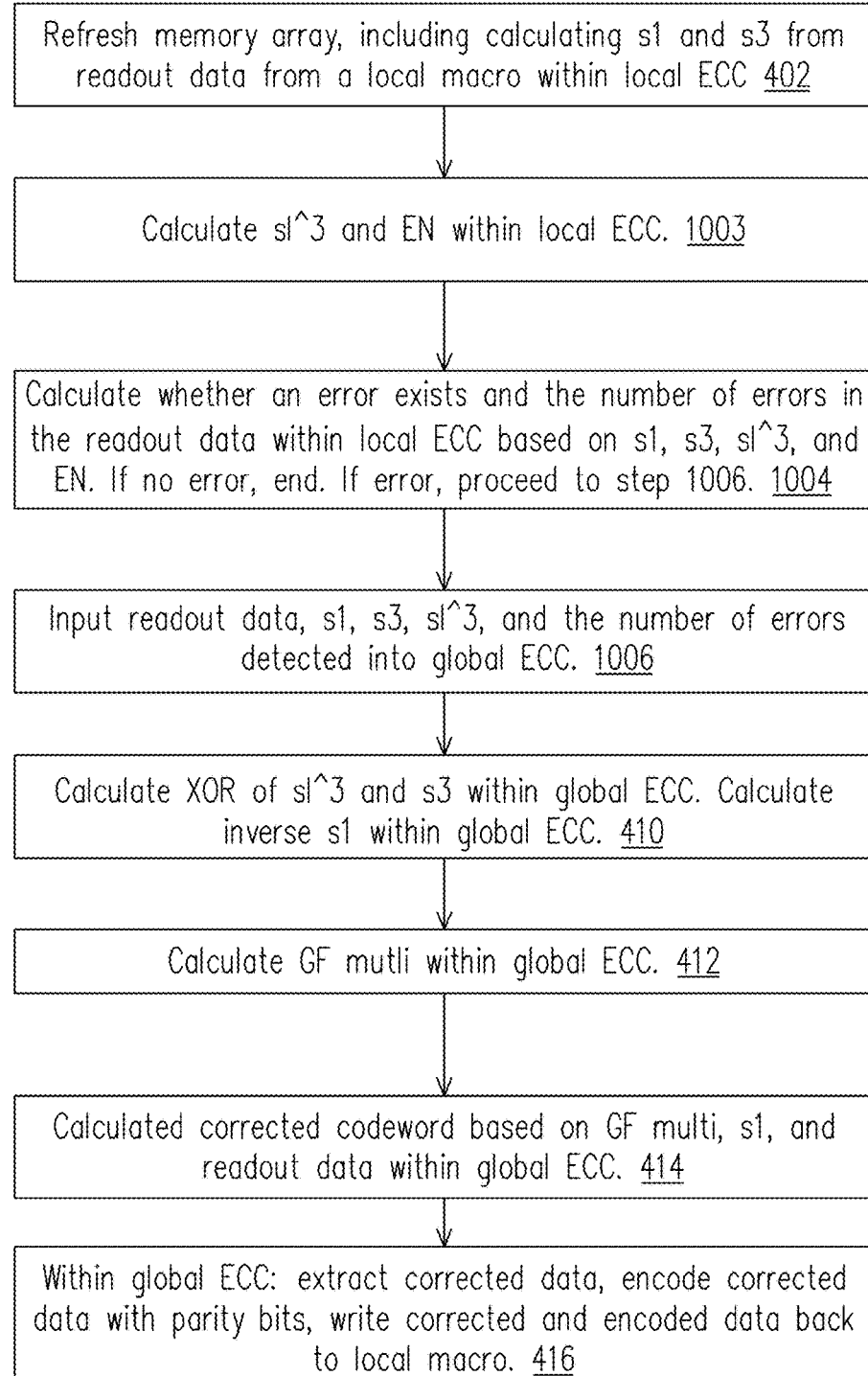
FIG. 10 is a flowchart of a method for correcting MRAM errors using an ECC logic process according to an embodiment.

FIG. 10 is a flowchart of a method 1000 for correcting MRAM errors using ECC logic process 900. The method 1000 is similar to method 800 above with four differences. First, step 1003 is included after step 402, in which s1^3 and EN are calculated by the x^3 calculation circuit 351 and the EN calculation circuit 352, respectively, within the local ECC logic 340. Second, step 404 is replaced with step 1004, in which the existence of an error in the readout data and the number of errors in the readout data is calculated by the error detection circuit 357 within the local ECC logic 340, and is based on the s1, s3, s1^3, and EN calculations. If there is no error, the method 1000 ends for that codeword, and begins at step 402 of the method 1000 for the next codeword in the refresh cycle for the local memory array 102*a*. Third, if there is at least one error, the method 1000 proceeds to step 1006 in which the readout data, syndromes s1 and s3, s1^3, and the number of errors detected are input into the global ECC logic 360. Fourth, the method 1000 replaces step 616 of method 800 with step 416 of method 400, that is, at step 416 of the method 1000, the corrected word, e.g. the corrected data, is extracted from the corrected codeword and the check bit generator 353 within the global ECC logic 360 encodes the corrected data with parity bits using a predefined parity-check matrix according to a chosen ECC type or scheme, and the corrected and encoded codeword is written back to the local macro 130.

Figure 11:
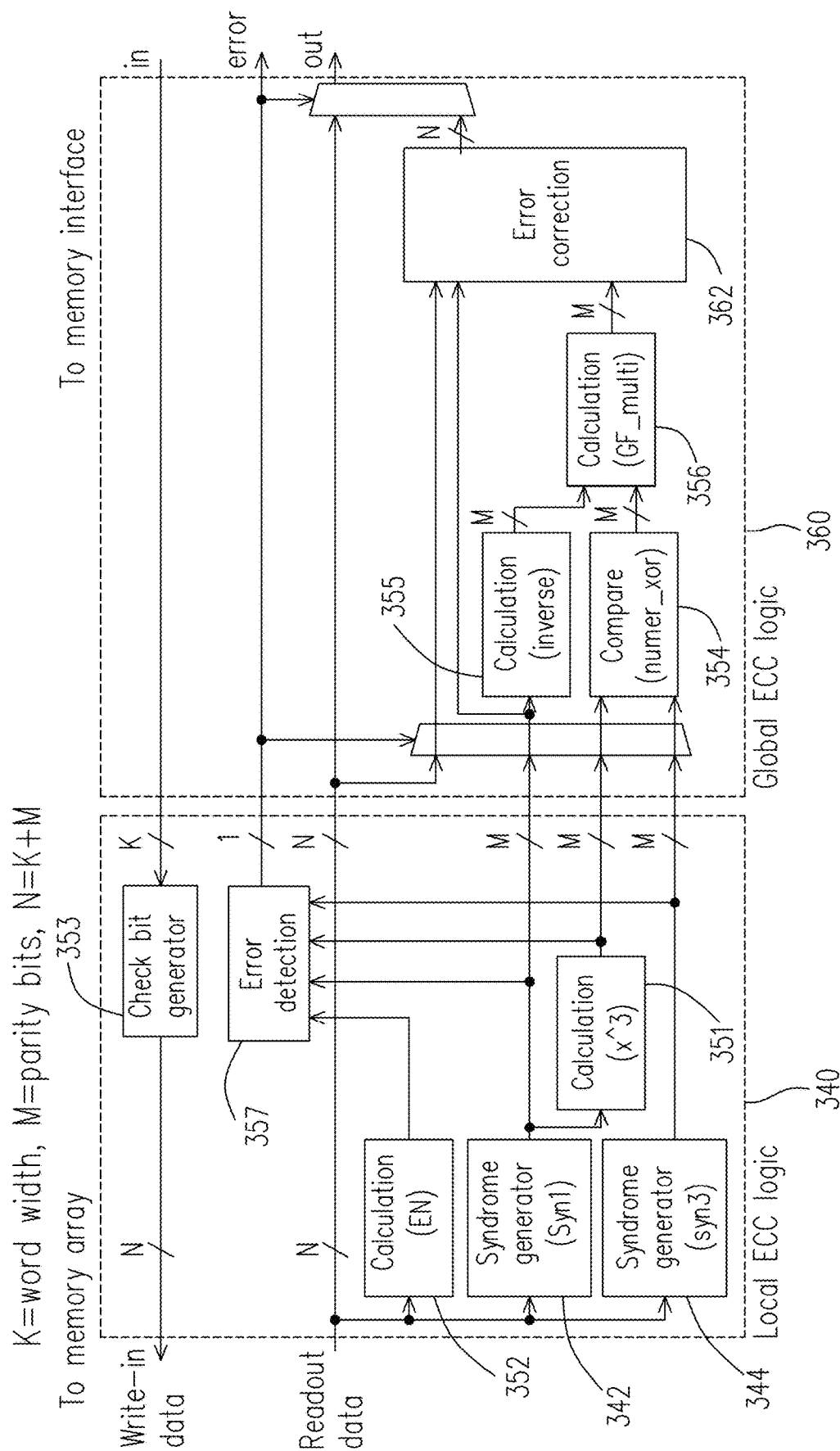
FIG. 11 is a block diagram generally illustrating an example ECC logic process for MRAM error correction according to an embodiment.

FIG. 11 is a block diagram generally illustrating an example ECC logic process 1100 for MRAM error correction according to an embodiment. The ECC logic process 1100 is similar to the ECC logic process 900 above, the difference being that the check bit generator 353 is no longer included in the global ECC logic 360, but is included in the local ECC logic 340. As stated above in connection with the ECC logic process 500 of FIG. 5, this difference offloads the operations of encoding parity bits into the corrected data and writing the resulting corrected codeword to the local memory array 102a to the local ECC logic 360 associated with the local memory array 102a, such that the global ECC logic is no longer responsible for encoding parity and writing corrected codewords for the plurality of memory macros 130a-n that share the global ECC logic 360.

Figure 12:
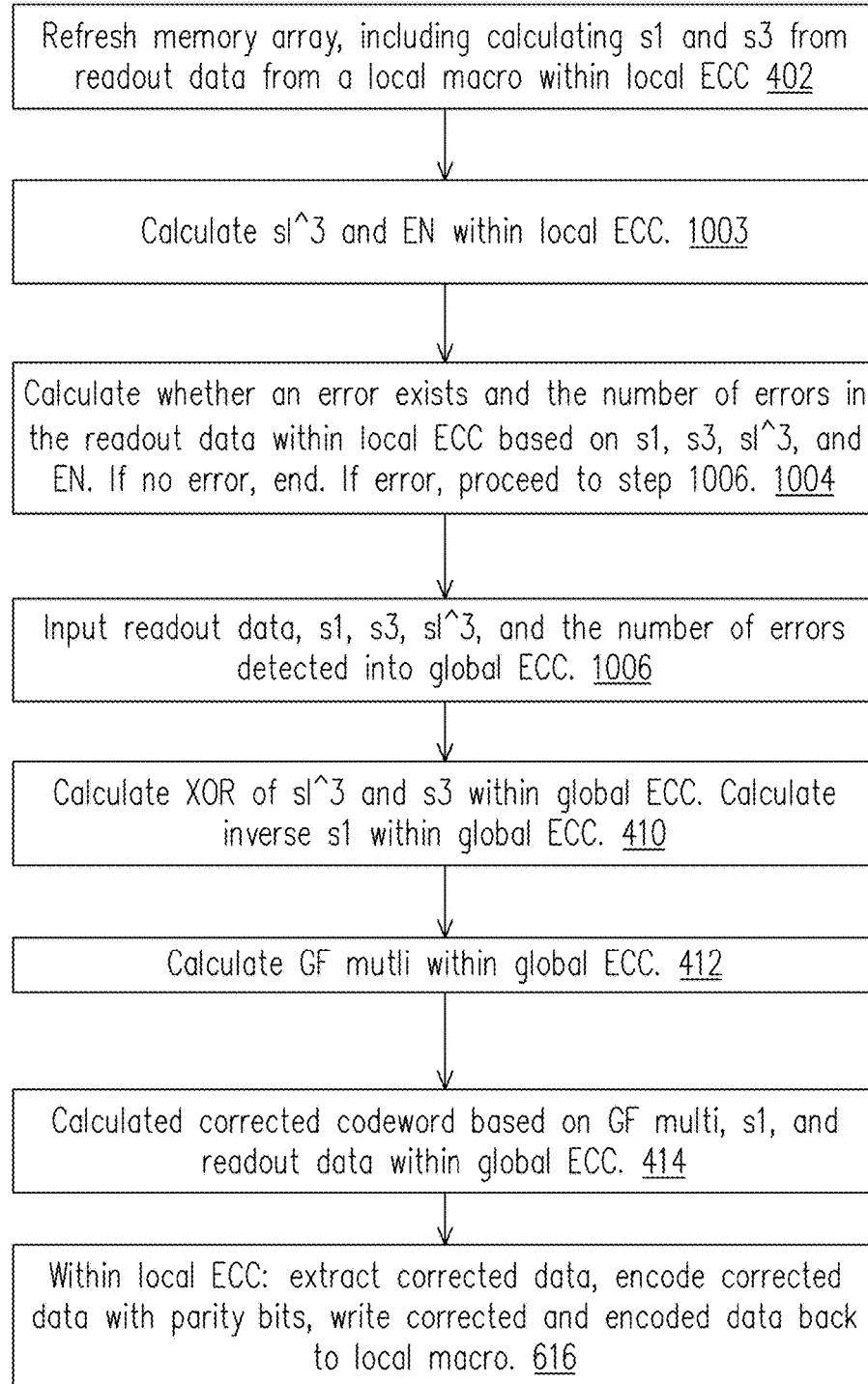
FIG. 12 is a flowchart of a method for correcting MRAM errors using an ECC logic process according to an embodiment.

FIG. 12 is a flowchart of a method 1200 for correcting MRAM errors using ECC logic process 1100. The Method 1200 is similar to the method 1000 above, the difference being that at step 416 is replaced with step 616 such that extracting the corrected word, e.g. the corrected data, from the corrected codeword and encoding the corrected data with parity bits using a predefined parity-check matrix according to a chosen ECC type or scheme, and writing the corrected and encoded codeword back to the local memory array 102 associated with the local ECC logic 340 are performed within the local ECC logic 340, such as with methods 600 and 800, rather than within the global ECC logic 360.

Figure 13:
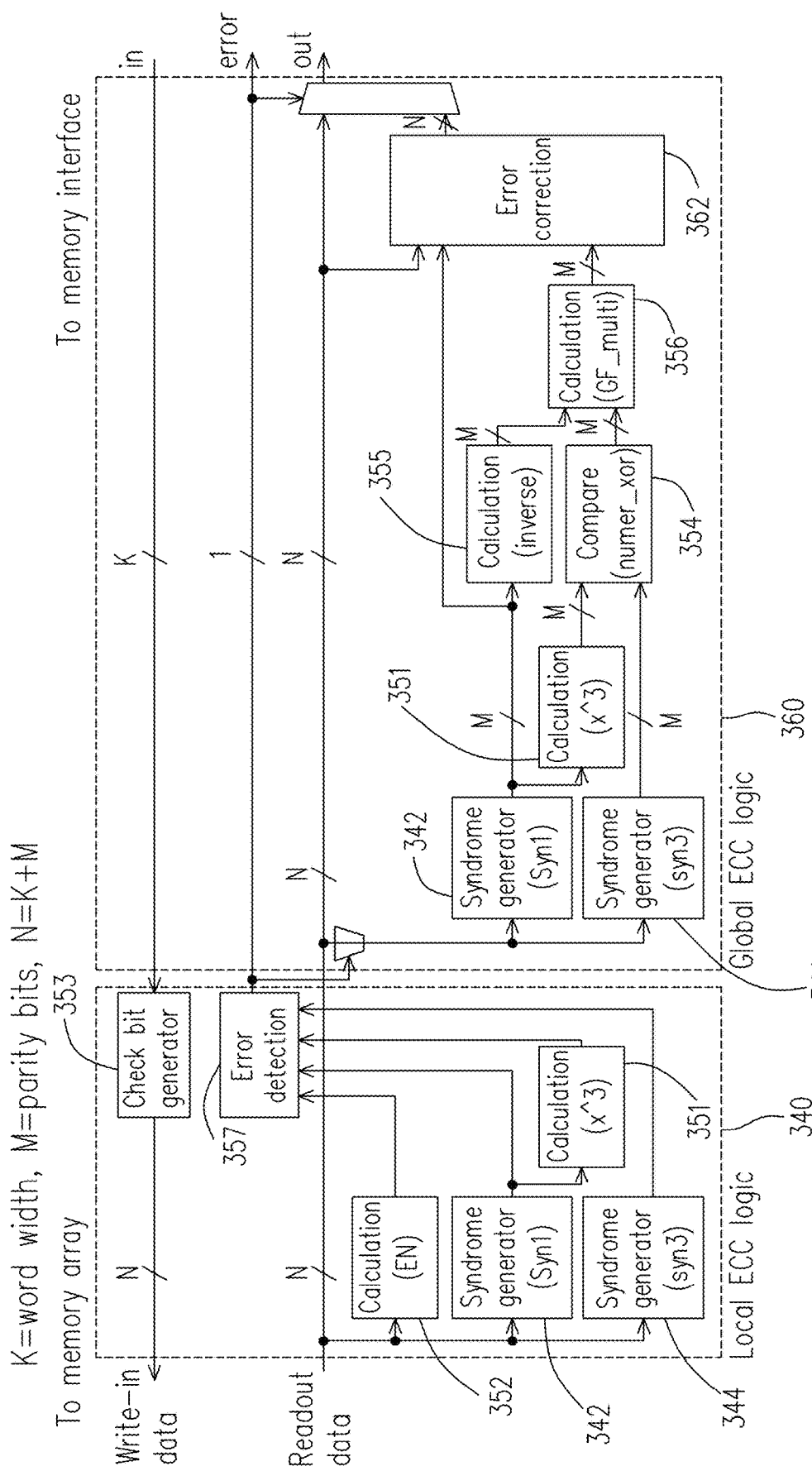
FIG. 13 is a block diagram generally illustrating an example ECC logic process for MRAM error correction according to an embodiment.

FIG. 13 is a block diagram generally illustrating an example ECC logic process 1300 for MRAM error correction according to an embodiment. The ECC logic process 1300 is similar to the ECC logic process 1100 above, the difference being that the syndrome s1 generator 342, the syndrome s3 generator 344, and the cube calculation circuit 351 are duplicated within the global ECC logic 360. As described above in connection with FIG. 7, duplicating the syndrome s1 generator 342, the syndrome s3 generator 344, and the cube calculation circuit 351 within the global ECC logic 360 may reduce the number of connections needed within the overall hierarchical ECC scheme, and may also simplify the layout structure.

Figure 14:
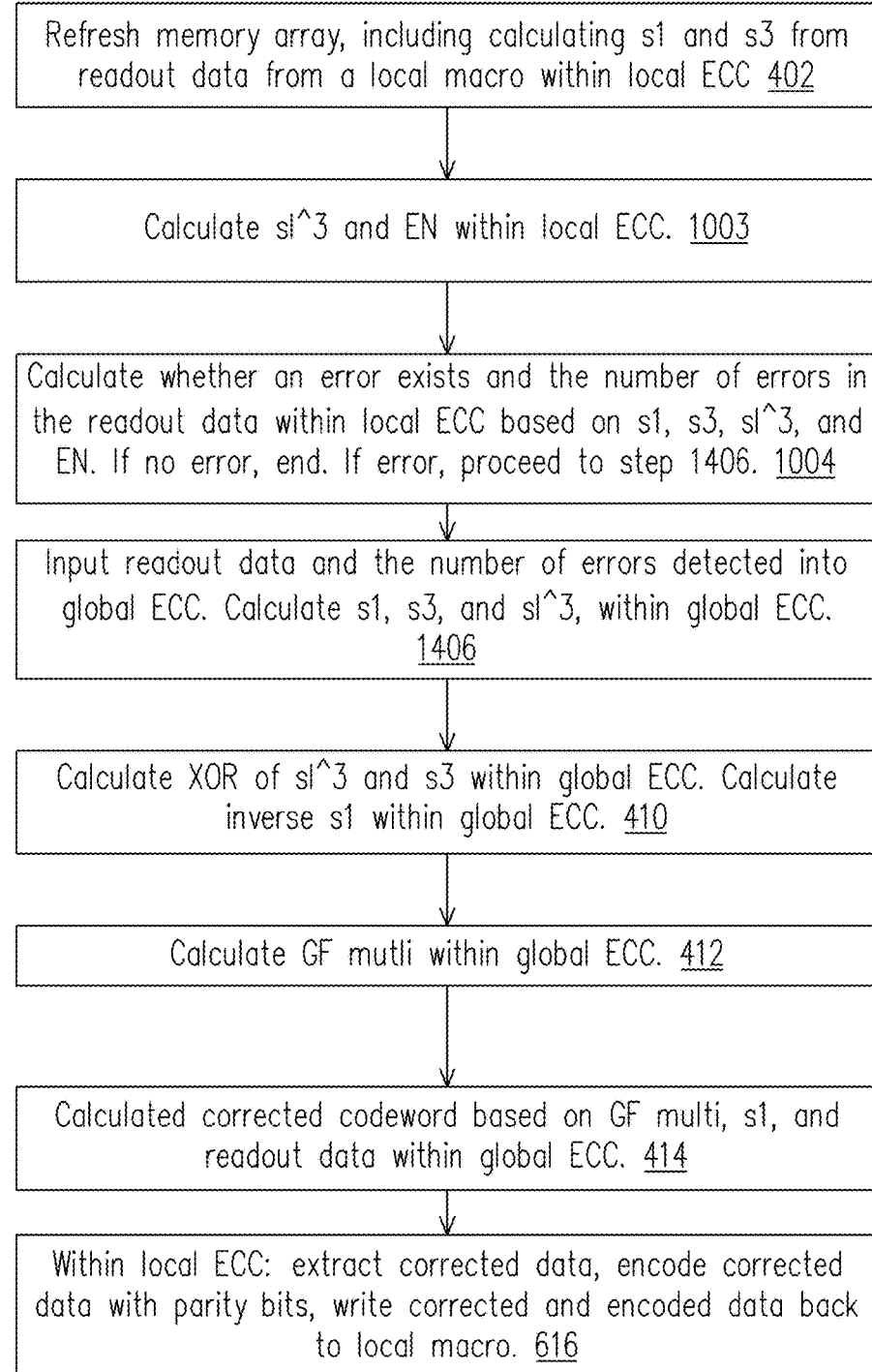
FIG. 14 is a flowchart of a method for correcting MRAM errors using an ECC logic process according to an embodiment.

FIG. 14 is a flowchart of a method 1400 for correcting MRAM errors using ECC logic process 1300. Method 1400 is similar to the method 1200 above, the difference being that a step 1406 replaces step 1006. In other words, the syndromes s1 and s3, and s1^3, are calculated within the global ECC logic 360 in duplication of those quantities that are calculated within the local ECC logic 340. This is in lieu of inputting those quantities into the global ECC logic 360 from the local ECC logic 340, as is done in step 1006 of method 1200. As such, step 1406 of method 1400 includes inputting the readout data and number of errors detected from step 1004 into the global ECC logic 360, as well as duplicating the calculations of s1, s3, and s1^3 within the global ECC logic 360. This is similar to the duplication that occurs in the method 800 shown in FIG. 8 in association with the ECC process 700 of FIG. 7.

Figure 15:
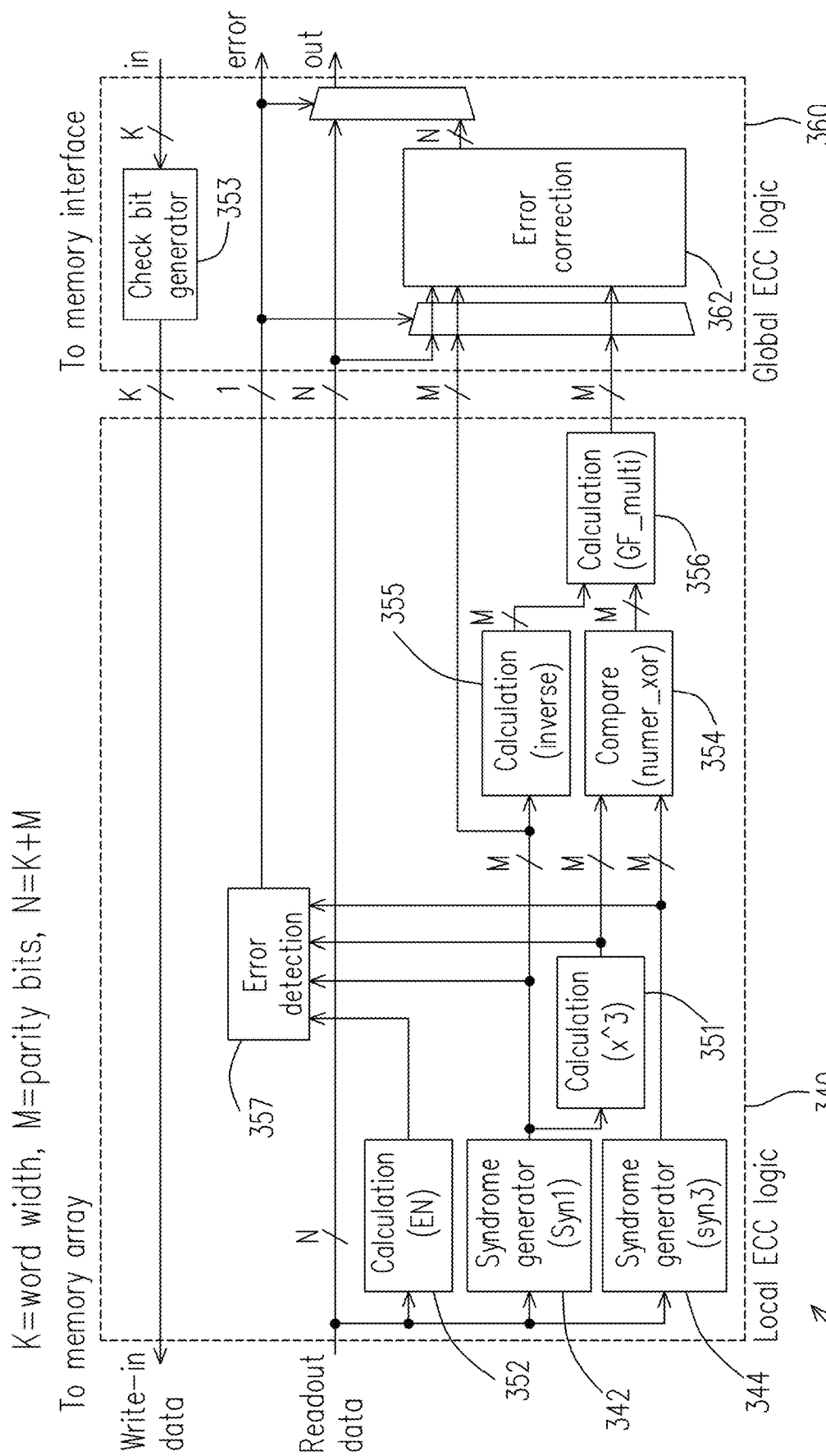
FIG. 15 is a block diagram generally illustrating an example ECC logic process for MRAM error correction according to an embodiment.

FIG. 15 is a block diagram generally illustrating an example ECC logic process 1500 for MRAM error correction according to an embodiment. The ECC logic process 1500 is similar to the ECC logic process 900 above, the difference being that the XOR circuit 354, the inverse calculation circuit 355, and the GF multi calculation circuit 356 are included in the local ECC logic 340 and are no longer included in the global ECC logic 360. Including the XOR circuit 354, the inverse calculation circuit 355, and the GF multi calculation circuit 356 in the local ECC logic 340 increases the computational utility and power of the local ECC logic. As described above in connection with the ECC process 900 and FIG. 9, the efficiency of the MRAM device 100 can be increased by adjusting the balance between area, energy consumption, and data latency associated with error checking by increasing the operations performed locally as data error rates increase, e.g. trading off area by implementing more error checking circuitry locally within local ECC circuits 140a-n to decrease data latency and energy consumption associated with moving data to a shared global ECC circuit 160. For example, in the ECC logic process 1500, the local ECC logic 340 performs all ECC operations locally except for error correction and coding and writing the error-corrected data back to the local macro.

Figure 16:
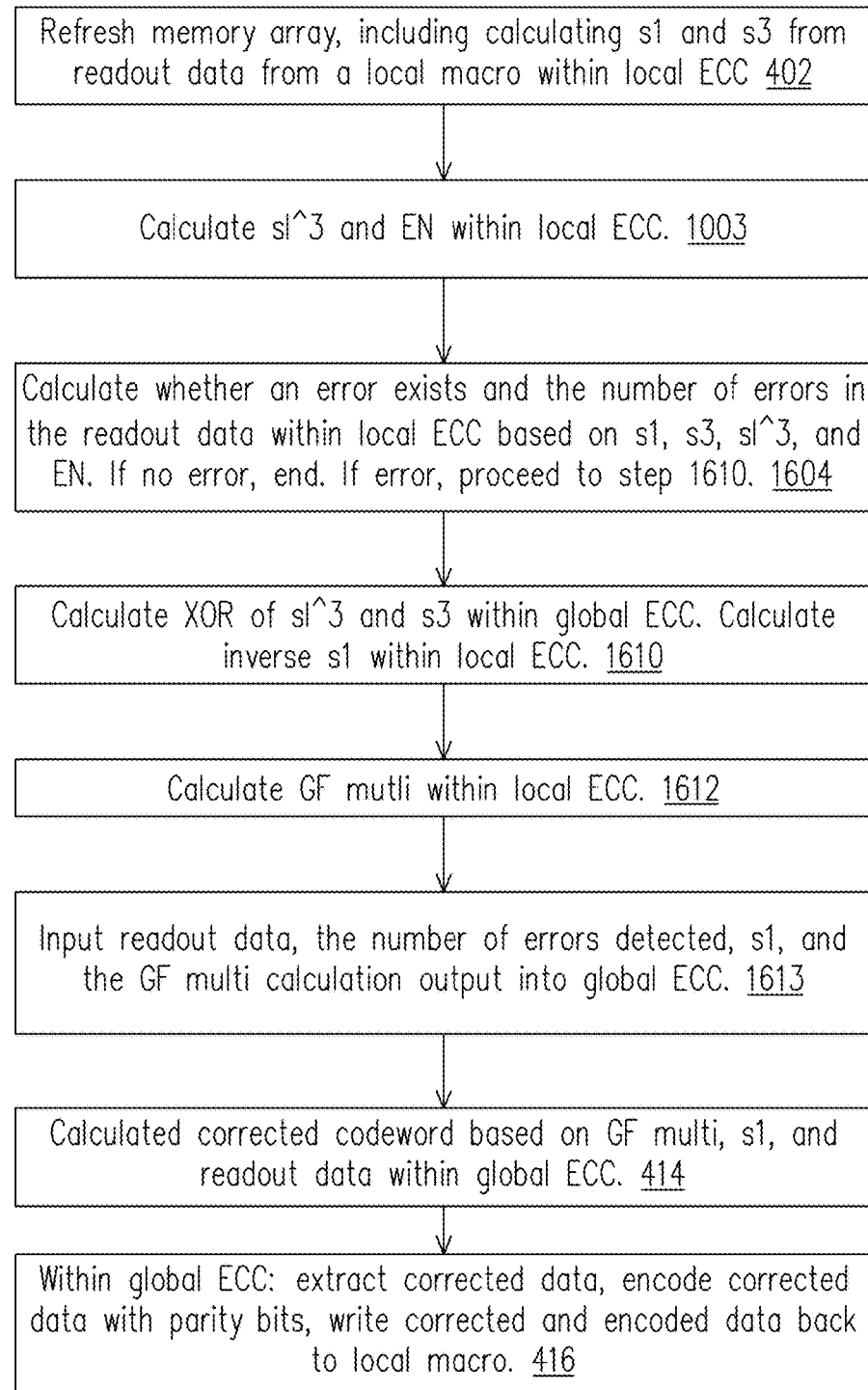
FIG. 16 is a flowchart of a method for correcting MRAM errors using an ECC logic process according to an embodiment.

FIG. 16 is a flowchart of a method 1600 for correcting MRAM errors using ECC logic process 1500. Method 1600 is similar to the method 1000 above with five differences. First, the method 1600 replaces step 1004 of the method 1000 with step 1604. Step 1604 of the method 1600 performs the same operations as step 1004 of the method 1000, that is, the calculation of whether an error exists and the number of errors in the readout data within the local ECC logic 340 based on the calculations of s1, s3, s1^3, and EN. The only difference is that if an error does exist in the readout data, step 1604 proceeds to step 1610 of the method 1600, rather than step 1006. This is because of the additional circuits included within the local ECC logic 340 in the ECC logic process 1500. Second, step 1006 is not performed in the method 1600, but rather, and as the third difference from the method 1000, step 1610 proceeds from step 1604 in the method 1600. In step 1610, the XOR of s1^3 with s3 is calculated, such as by the XOR calculation circuit 354, along with the inverse s1, such as by the inverse calculation circuit 355 within the local ECC logic 340. Fourth, the GF multi is calculated within the local ECC logic 340 at step 1612, and fifth, at step 1613 the readout data, number of detected errors, s1, and the GF multi calculation result are input into the global ECC logic 360 and used for calculation of the corrected codeword at step 414 of method 1600.

Figure 17:
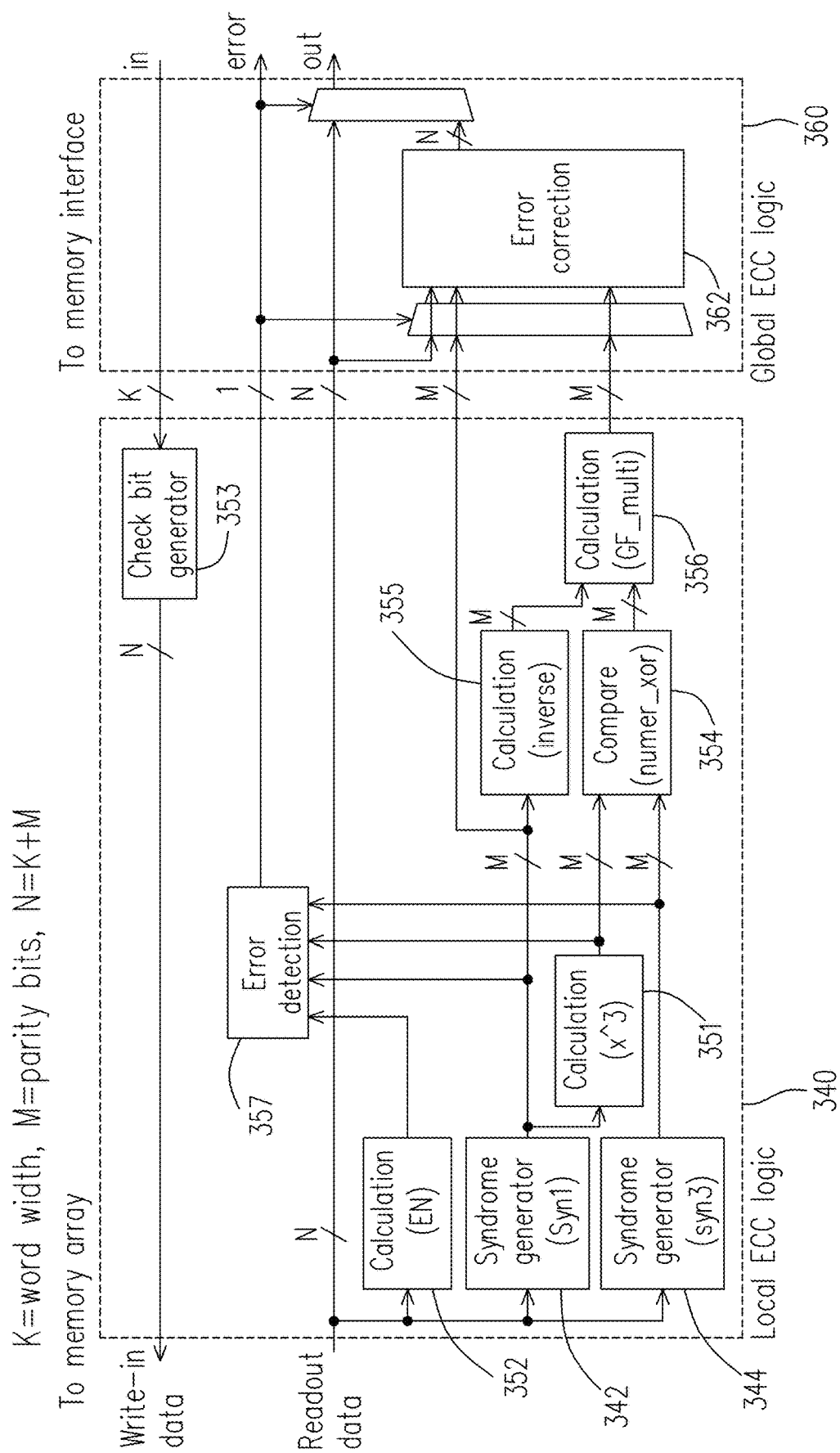
FIG. 17 is a block diagram generally illustrating an example ECC logic process for MRAM error correction according to an embodiment.

FIG. 17 is a block diagram generally illustrating an example ECC logic process 1700 for MRAM error correction according to an embodiment. The ECC logic process 1700 is similar to the ECC logic process 1500 above, the difference being that the check bit generator 353 is no longer included in the global ECC logic 360, but is included in the local ECC logic 340. As stated above in connection with FIGS. 5 and 11, this difference of the ECC logic process 1700 offloads the operations of encoding parity bits into the corrected data and writing the resulting corrected codeword to the local memory array 102a to the local ECC logic 340 associated with the local memory array 102a, such that the global ECC logic 360 is no longer responsible for encoding parity and writing corrected codewords for the plurality of memory macros 130a-n that share the global ECC logic 360.

Figure 18:
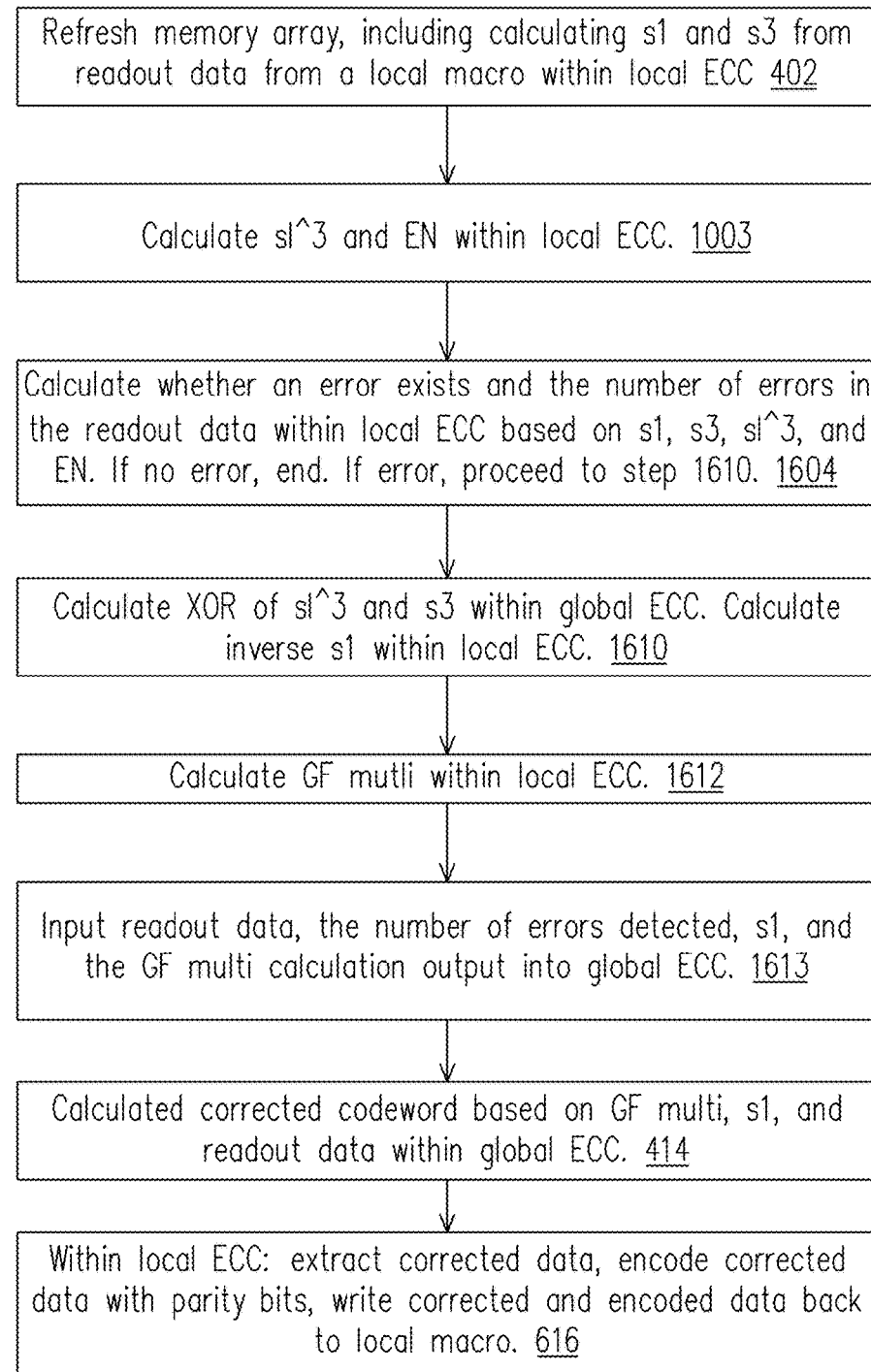
FIG. 18 is a flowchart of a method for correcting MRAM errors using an ECC logic process according to an embodiment.

FIG. 18 is a flowchart of a method 1800 for correcting MRAM errors using ECC logic process 1700. Method 1800 is similar to the method 1600 above, the difference being that step 416 is replaced with step 616 such that extracting the corrected word, e.g. the corrected data, from the corrected codeword and encoding the corrected data with parity bits using a predefined parity-check matrix according to a chosen ECC type or scheme, and writing the corrected and encoded codeword back to the local memory macro 130 associated with the local ECC logic 340 are performed within the local ECC logic 340, such as with the methods 600, 800, 1200, and 1400 rather than within the global ECC logic 360.

Figure 19:
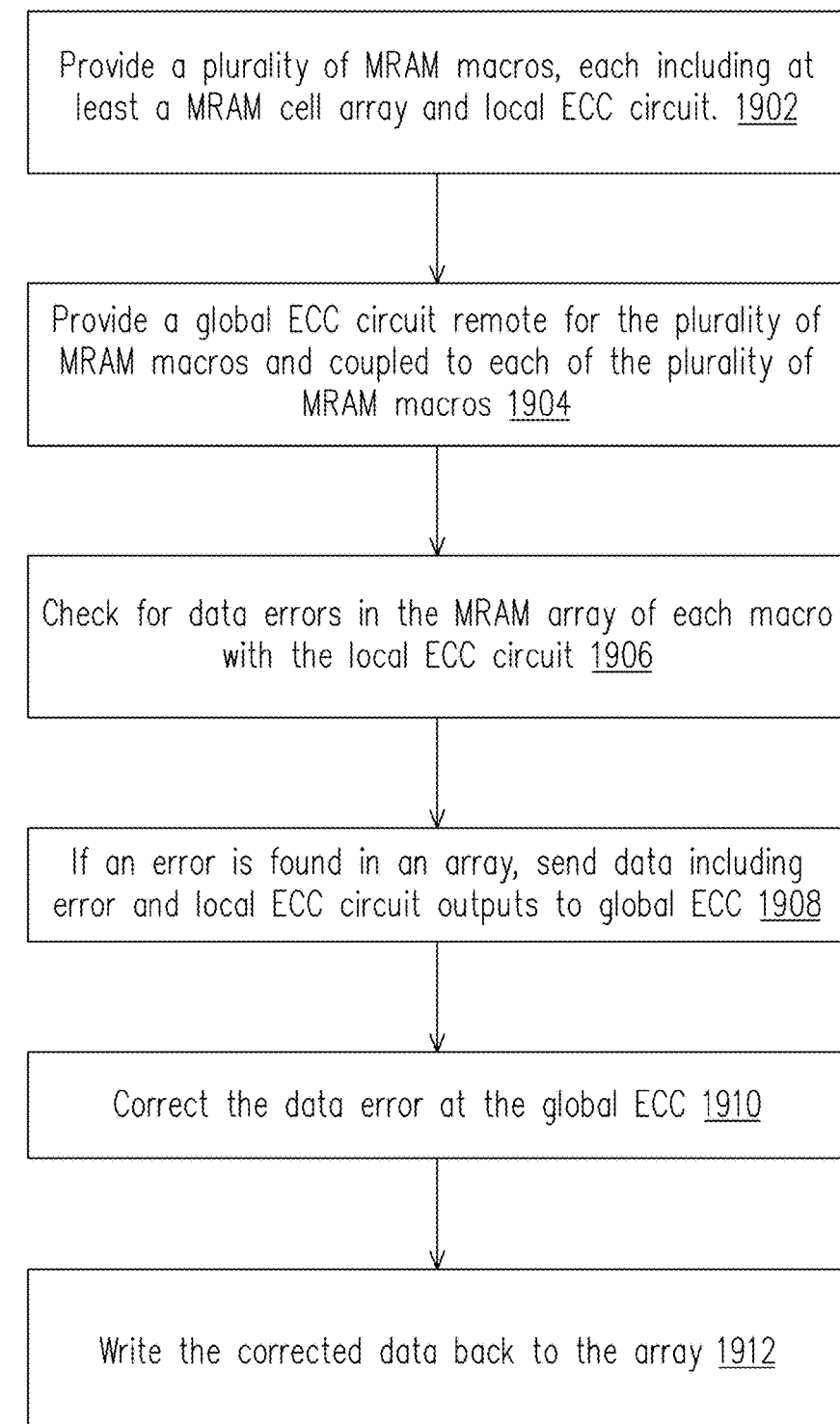
FIG. 19 is a flowchart of a method for correcting MRAM errors using a hierarchical ECC logic process according to an embodiment.

FIG. 19 is a flowchart of a method 1900 for correcting MRAM errors using a hierarchical ECC logic process according to some embodiments. Method 1900 begins at step 1902, where a plurality of memory macros, e.g. MRAM memory macros 130a-n, each including at least a memory cell array and a local ECC logic circuit, are provided. In some embodiments, the plurality of memory macros includes the local memory arrays 102a-n, each of which includes the local ECC logic 140*a-n*, respectively. At step 1904, a global ECC logic circuit that is remote from the plurality of MRAM macros and coupled to each of the plurality of MRAM macros is provided. In some embodiments, the global ECC logic circuit includes the global ECC logic 160. At step 1906, data from the local MRAM macros is checked, for example, as part of a refresh cycle in which portions of local MRAM memory, e.g. readout data or codewords, are checked for errors within the local ECC logic circuit. If no errors are found in a particular codeword, the next codeword in the macro is checked as part of the refresh cycle. Method 1900 then proceeds to step 1908, where, if at least one error is found in the memory array of a local macro, the data that was checked and found to have at least one error, e.g. the codeword with the at least one error, is sent to a global ECC logic along with the outputs of the calculation circuits within the local ECC logic circuit. At step 1910, the data having at least one error is corrected within the global ECC logic circuit, and at step 1912 the corrected data is written back to the local macro memory array.

Disclosed examples thus provide error detection and correction for memory devices, and more particularly, for short retention memory devices such as MRAM that requires periodical refresh. By using a hierarchical ECC approach where some ECC functions are provided locally to a memory macro and other ECC functions are provided globally, macro area reduction as well as power reduction for MRAM devices may be achieved at a sufficiently low error rate. Certain disclosed embodiments include a memory device, such as an MRAM memory device, having a plurality of memory macros that each includes an array of memory cells and a first ECC circuit. The first ECC circuit is configured to detect data errors in the respective memory macro. A second ECC circuit is remote from the plurality of memory macros and is communicatively coupled to each of the plurality of memory macros. The second ECC circuit is configured to receive the detected data errors from the first ECC circuits of the plurality of memory macros and correct the data errors.

In accordance with further aspects, an ECC system includes a plurality of first ECC circuits. Each of the plurality of first ECC circuits is configured to be communicatively coupled to a respective memory array and configured to detect data errors in the respective memory array. A second ECC circuit is communicatively coupled to each of the plurality of first ECC circuits and is configured to receive the detected data errors from the plurality of first ECC circuits and correct the data errors.

In accordance with still further aspects, a method includes providing a plurality of memory macros that each include an array of memory cells and a first ECC circuit. The method further includes providing a second ECC circuit that is remote from the plurality of memory macros and is communicatively coupled to each of the plurality of memory macros, and refreshing the memory arrays including checking for data errors in the memory arrays with the first ECC circuits. If a data error is identified by the first ECC circuits, the method further includes forwarding the detected data error to the second ECC circuit, correcting the data error by the second ECC circuit, and writing the corrected data to the memory arrays.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of memory macros, each including a respective array of memory cells, and a first error correction code (ECC) circuit configured to receive data from the respective memory macro and carry out a subset of steps in an error detection and correction operation by detecting data errors in the received data; and
a second ECC circuit remote from the plurality of memory macros and communicatively coupled to each of the plurality of memory macros, and configured to receive the detected data errors from each of the first ECC circuits of the plurality of memory macros and carry out remainder steps of the error detection and correction operation, the remainder steps including correcting the data errors and writing the corrected data to the array of memory cells in the memory macro,
the first ECC circuit being further configured to end the error detection and correction operation for the received data when the first ECC circuit detects no error in the received data.

2. The memory device of claim 1, wherein the memory macros each comprise a magnetic random access memory (MRAM) macro.

3. The memory device of claim 2, wherein the MRAM macros each further comprise:
an array of MRAM bit cells, each MRAM bit cell comprising:
a magnetic tunnel junction element;
an access transistor coupled to the magnetic tunnel junction element;
a first bit line coupled to the access transistor;
a second bit line coupled to the magnetic tunnel junction element;
a word line coupled to the gate of the access transistor; and
local input-output circuitry coupled to the first and second bit lines of the MRAM bit cells.

4. The memory device of claim 3, wherein the first ECC circuit comprises:
a first syndrome s1 generator coupled to the first and second bit lines;
a second syndrome s3 generator coupled to the first and second bit lines;
an error check circuit coupled to outputs of each of the first syndrome s1 generator and the second syndrome s3 generator.

5. The memory device of claim 4, wherein the second ECC circuit comprises:
an encoder (EN) calculation circuit coupled to the local input-output circuitry;
a syndrome s1^3 calculation circuit coupled to the output of the first syndrome s1 generator;
a syndrome s1 inversion circuit coupled to the output of the first syndrome s1 generator;
a syndrome comparator coupled to the output of the syndrome s1^3 generator and the output of the second syndrome s3 generator;

a GF multi calculation circuit coupled to the output of the syndrome comparator and the output of the syndrome s1 inversion circuit;
an error correction circuit coupled to the local input-output circuitry, the syndrome s1 generator, and the GF multi calculation circuit; and
a check bit generator circuit to correct the MRAM cells with an error.

6. The memory device of claim 3, wherein the first ECC circuit comprises:
a first syndrome s1 generator coupled to the first and second bit lines;
a second syndrome s3 generator coupled to the first and second bit lines;
an EN calculation circuit coupled to the local input-output circuitry;
a syndrome s1^3 calculation circuit coupled to the output of the first syndrome s1 generator;
an error check circuit coupled to the output of each of the first syndrome s1 generator, the second syndrome s3 generator, the EN calculation circuit, and the syndrome s1^3 calculation circuit.

7. The memory device of claim 6, wherein the second ECC circuit comprises:
a syndrome s1 inversion circuit coupled to the output of the first syndrome s1 generator;
a syndrome comparator coupled to the output of the syndrome s1^3 generator and the output of the second syndrome s3 generator;
a GF multi calculation circuit coupled to the output of the syndrome comparator and the output of the syndrome s1 inversion circuit; an error correction circuit coupled to the local input-output circuitry, the syndrome s1 generator, and the GF multi calculation circuit; and
a check bit generator circuit to correct the MRAM cells with an error.

8. The memory device of claim 3, wherein the first ECC circuit comprises:
a first syndrome s1 generator coupled to the first and second bit lines;
a second syndrome s3 generator coupled to the first and second bit lines;
an EN calculation circuit coupled to the local input-output circuitry;
a syndrome s1^3 calculation circuit coupled to the output of the first syndrome s1 generator;
an error check circuit coupled to the output of each of the first syndrome s1 generator, the second syndrome s3 generator, the EN calculation circuit, and the syndrome s1^3 calculation circuit;
a syndrome s1 inversion circuit coupled to the output of the first syndrome s1 generator;
a syndrome comparator coupled to the output of the syndrome s1^3 generator and the output of the second syndrome s3 generator; and
a GF multi calculation circuit coupled to the output of the syndrome comparator and the output of the syndrome s1 inversion circuit.

9. The memory device of claim 8, wherein the second ECC circuit comprises:
an error correction circuit coupled to the local input-output circuitry, the syndrome s1 generator, and the GF multi calculation circuit; and
a check bit generator circuit to correct the MRAM cells with an error.

10. An ECC system comprising:
a plurality of first ECC circuits, each of the plurality of first ECC circuits configured to be communicatively coupled to a respective memory array and configured to receive data from the respective memory array and carry out a subset of steps in an error detection and correction operation by detecting data errors in the received data; and
a second ECC circuit communicatively coupled to each of the plurality of first ECC circuits and configured to receive the detected data errors from each of the plurality of first ECC circuits and correct the data errors and carry out remainder steps of the error detection and correction operation, the remainder steps including correcting the data errors and writing the corrected data to the respective memory macro,
the first ECC circuit being further configured to end the error detection and correction operation for the received data when the first ECC circuit detects no error in the received data.

11. The ECC system of claim 10, each of the plurality of first ECC circuits comprising:
a first syndrome s1 generator coupled to the first and second bit lines;
a second syndrome s3 generator coupled to the first and second bit lines; and
an error check circuit coupled to the output of each of the first syndrome s1 generator and the second syndrome s3 generator; and
the second ECC circuit comprising:
an EN calculation circuit coupled to the local input-output circuitry;
a syndrome s1^3 calculation circuit coupled to the output of the first syndrome s1 generator;
a syndrome s1 inversion circuit coupled to the output of the first syndrome s1 generator;
a syndrome comparator coupled to the output of the syndrome s1^3 generator and the output of the second syndrome s3 generator;
a GF multi calculation circuit coupled to the output of the syndrome comparator and the output of the syndrome s1 inversion circuit;
an error correction circuit coupled to the local input-output circuitry, the syndrome s1 generator, and the GF multi calculation circuit; and
a check bit generator circuit to correct the memory cells having an error.

12. The ECC system of claim 10, each of the plurality of first ECC circuits comprising:
a first syndrome s1 generator coupled to the first and second bit lines;
a second syndrome s3 generator coupled to the first and second bit lines;
an EN calculation circuit coupled to the local input-output circuitry;
a syndrome s1^3 calculation circuit coupled to the output of the first syndrome s1 generator; and
an error check circuit coupled to the output of each of the first syndrome s1 generator, the second syndrome s3, the EN calculation circuit, and the syndrome s1^3 calculation circuit;
the second ECC circuit comprising:
a syndrome s1 inversion circuit coupled to the output of the first syndrome s1 generator;
a syndrome comparator coupled to the output of the syndrome s1^3 generator and the output of the second syndrome s3 generator;

a GF multi calculation circuit coupled to the output of the syndrome comparator and the output of the syndrome s1 inversion circuit;

an error correction circuit coupled to the local input-output circuitry, the syndrome s1 generator, and the GF multi calculation circuit; and a check bit generator circuit to correct the memory cells having an error.

13. The ECC system of claim 10, each of the plurality of first ECC circuits comprising:

a first syndrome s1 generator coupled to the first and second bit lines;

a second syndrome s3 generator coupled to the first and second bit lines;

an EN calculation circuit coupled to the local input-output circuitry;

a syndrome s1^3 calculation circuit coupled to the output of the first syndrome s1 generator;

an error check circuit coupled to the output of each of the first syndrome s1 generator, the second syndrome s3, the EN calculation circuit, and the syndrome s1^3 calculation circuit;

a syndrome s1 inversion circuit coupled to the output of the first syndrome s1 generator;

a syndrome comparator coupled to the output of the syndrome s1^3 generator and the output of the second syndrome s3 generator; and a GF multi calculation circuit coupled to the output of the syndrome comparator and the output of the syndrome s1 inversion circuit;

the second ECC circuit comprising:

an error correction circuit coupled to the local input-output circuitry, the syndrome s1 generator, and the GF multi calculation circuit; and a check bit generator circuit to correct the memory cells having an error.

14. A method, comprising:

providing a plurality of memory macros, each including an array of memory cells and a first ECC circuit;

providing a second ECC circuit remote from the plurality of memory macros and communicatively coupled to each of the plurality of memory macros;

refreshing the memory arrays, including carrying out an error detection and correction operation, including carrying out a subset of steps in an error detection and correction operation by checking for data errors in the memory arrays with the first ECC circuits in the respective memory macros;

if any data error is detected by one of the plurality of the first ECC circuits, carrying out remainder steps of the error detection and correction operation, the remainder steps including:

forwarding the detected data errors from the first ECC circuit to the second ECC circuit;

correcting the data error by the second ECC circuit;

writing the corrected data to the respective memory array; and if no data error is detected by one of the plurality of the first ECC circuits, ending the error detection and correction operation for the respective memory macro.

15. The method of claim 14, wherein checking for data errors in the MRAM array with the first ECC circuits comprises:

generating a syndrome s1 based on data received from the MRAM array;

generating a syndrome s3 based on data received from the MRAM array; and error checking based on the syndrome s1 and the syndrome s3.

16. The method of claim 15, wherein correcting the data error with the second ECC circuit comprises:

generating an EN based on data received from the MRAM array;

generating a syndrome s1^3 based on the syndrome s1;

generating a syndrome s1 inversion based on the syndrome s1;

comparing the syndrome s1^3 and the syndrome s3;

generating a GF multi calculation based on the syndrome s1 inversion and the comparison of the syndrome s1^3 and the syndrome s3;

generating a check bit error correction based on the EN, the syndrome s1, and the GF multi calculation; and writing the check bit error correction to the MRAM array to correct the error.

17. The method of claim 14, wherein checking for data errors in the MRAM array with the first ECC circuits comprises:

generating a syndrome s1 based on data received from the MRAM array;

generating a syndrome s3 based on data received from the MRAM array;

generating an EN based on data received from the MRAM array;

generating a syndrome s1^3 based on the syndrome s1; and error checking based on the syndrome s1, the syndrome s3, the EN, and the syndrome s1^3.

18. The method of claim 17, wherein correcting the data error with the second ECC circuit comprises:

generating a syndrome s1 inversion based on the syndrome s1;

comparing the syndrome s1^3 and the syndrome s3;

generating a GF multi calculation based on the syndrome s1 inversion and the comparison of the syndrome s1^3 and the syndrome s3;

generating a check bit error correction based on the EN, the syndrome s1, and the GF multi calculation; and writing the check bit error correction to the MRAM array to correct the error.

19. The method of claim 14, wherein checking for data errors in the MRAM array with the first ECC circuits comprises:

Generating a syndrome s1 based on data received from the MRAM array;

generating a syndrome s3 based on data received from the MRAM array;

generating an EN based on data received from the MRAM array;

generating a syndrome s1^3 based on the syndrome s1;

error checking based on the syndrome s1, the syndrome s3, the EN, and the syndrome s^3;

generating a syndrome s1 inversion based on the syndrome s1;

comparing the syndrome s1^3 and the syndrome s3; and generating a GF multi calculation based on the syndrome s1 inversion and the comparison of the syndrome s1^3 and the syndrome s3.

20. The method of claim 19, wherein correcting the data error with the second ECC circuit comprises:

Generating a check bit error correction based on the EN, the syndrome s1, and the GF multi calculation; and writing the check bit error correction to the MRAM array to correct the error.

\* \* \* \* \*